US012009806B2

(12) United States Patent
Komatsu

(10) Patent No.: US 12,009,806 B2
(45) Date of Patent: *Jun. 11, 2024

(54) FREQUENCY CONTROL OF SPURIOUS SHEAR HORIZONTAL MODE BY ADDING HIGH VELOCITY LAYER IN A LITHIUM NIOBATE FILTER

(71) Applicant: SKYWORKS SOLUTIONS, INC., Irvine, CA (US)

(72) Inventor: Tomoya Komatsu, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 17/368,948

(22) Filed: Jul. 7, 2021

(65) Prior Publication Data

US 2021/0336605 A1 Oct. 28, 2021

Related U.S. Application Data

(63) Continuation of application No. 16/439,886, filed on Jun. 13, 2019, now Pat. No. 11,095,269.

(Continued)

(51) Int. Cl.
*H03H 9/64* (2006.01)
*H03H 9/205* (2006.01)
(Continued)

(52) U.S. Cl.
CPC .......... *H03H 9/6483* (2013.01); *H03H 9/205* (2013.01); *H03H 9/54* (2013.01); *H03H 9/72* (2013.01)

(58) Field of Classification Search
CPC ........ H03H 9/6483; H03H 9/205; H03H 9/54; H03H 9/72
See application file for complete search history.

(56) References Cited

U.S. PATENT DOCUMENTS 3,965,444 A 6/1976 Willingham et al.
11,095,269 B2 * 8/2021 Komatsu ............ H03H 9/02559
(Continued)

FOREIGN PATENT DOCUMENTS

JP 2010263296 A 11/2010
JP 2011061743 A 3/2011
(Continued)

OTHER PUBLICATIONS

Office Action from corresponding United Kingdom Application No. 1908520.8 dated Feb. 11, 2022.

*Primary Examiner* — Samuel S Outten
(74) *Attorney, Agent, or Firm* — Lando & Anastasi, LLP

(57) ABSTRACT

An electronic device comprises a first surface acoustic wave (SAW) resonator and a second SAW resonator, each including interleaved interdigital transducer (IDT) electrodes, the first and second SAW resonators being formed on a same piezoelectric substrate, the first SAW resonator having IDT electrodes with a different finger pitch than the IDT electrodes of the second SAW resonator; a dielectric material layer disposed on the IDT electrodes of the first and second SAW resonators; and a high velocity layer disposed within the dielectric material layer disposed on the IDT electrodes of the first SAW resonator, the second SAW resonator lacking a high velocity layer disposed within the dielectric material layer disposed on the IDT electrodes.

20 Claims, 20 Drawing Sheets

Related U.S. Application Data

(60) Provisional application No. 62/693,027, filed on Jul. 2, 2018, provisional application No. 62/684,330, filed on Jun. 13, 2018.

(51) Int. Cl.
*H03H 9/54* (2006.01)
*H03H 9/72* (2006.01)

(56) References Cited

U.S. PATENT DOCUMENTS

| | | |
|---|---|---|
| 2005/0077982 A1 | 4/2005 | Funasaka |
| 2006/0186968 A1 | 8/2006 | Ito |
| 2007/0018536 A1 | 1/2007 | Kadota et al. |
| 2008/0238572 A1 | 10/2008 | Funami et al. |
| 2009/0066189 A1 | 3/2009 | Kando |
| 2011/0175487 A1 | 7/2011 | Hansen et al. |
| 2013/0049533 A1 | 2/2013 | Matsuda et al. |
| 2013/0285504 A1 | 10/2013 | Tamasaki |
| 2013/0300519 A1 | 11/2013 | Tamasaki et al. |
| 2014/0167881 A1 | 6/2014 | Iwasaki et al. |
| 2018/0041186 A1 | 2/2018 | Yamaji et al. |
| 2019/0044498 A1 | 2/2019 | Kawasaki |
| 2019/0149132 A1 | 5/2019 | Komatsu et al. |
| 2019/0288664 A1* | 9/2019 | Saji .................... H03H 9/02866 |
| 2019/0386642 A1 | 12/2019 | Komatsu |

FOREIGN PATENT DOCUMENTS

| | | |
|---|---|---|
| JP | 2011528878 A | 11/2011 |
| JP | 2017220929 A | 12/2017 |
| TW | 200516846 A | 5/2005 |
| WO | 2012098816 A1 | 7/2012 |
| WO | 2017187724 A1 | 11/2017 |
| WO | 2017187768 A1 | 11/2017 |

\* cited by examiner

FREQUENCY CONTROL OF SPURIOUS SHEAR HORIZONTAL MODE BY ADDING HIGH VELOCITY LAYER IN A LITHIUM NIOBATE FILTER

CROSS-REFERENCE TO RELATED APPLICATIONS

This application claims priority under 35 U.S.C. § 120 as a continuation of U.S. patent application Ser. No. 16/439,886, titled FREQUENCY CONTROL OF SPURIOUS SHEAR HORIZONTAL MODE BY ADDING HIGH VELOCITY LAYER IN A LITHIUM NIOBATE FILTER, filed Jun. 13, 2019, that in turn claims priority under 35 U.S.C. § 119(e) to U.S. Provisional Patent Application Ser. No. 62/684,330, titled FREQUENCY CONTROL OF SPURIOUS SHEAR HORIZONTAL MODE BY ADDING HIGH VELOCITY LAYER IN A LITHIUM NIOBATE FILTER, filed Jun. 13, 2018 and to U.S. Provisional Patent Application Ser. No. 62/693,027, titled FREQUENCY CONTROL OF SPURIOUS SHEAR HORIZONTAL MODE BY ADDING HIGH VELOCITY LAYER IN A LITHIUM NIOBATE FILTER, filed Jul. 2, 2018. Each of these applications is incorporated herein by reference in its entirety.

BACKGROUND

In the field of information communication devices, for example, mobile phones, there is an increasing desire to include additional features within the device while also maintaining or reducing the space occupied by electronic circuitry of the device. Various information communication devices include filters to define frequency bands at which the devices transmit and receive signals. These filters may include surface acoustic wave elements formed on piezoelectric substrates. One method for reducing the size of such filters may include forming multiple surface acoustic wave elements for a filter in a single integrated circuit or multiple filters within a single integrated circuit.

SUMMARY

In accordance with an aspect disclosed herein, there is provided an electronic device. The electronic device comprises a first surface acoustic wave (SAW) resonator and a second SAW resonator, each including interleaved interdigital transducer (IDT) electrodes, the first and second SAW resonators being formed on a same piezoelectric substrate, the first SAW resonator having IDT electrodes with a different finger pitch than the IDT electrodes of the second SAW resonator, a dielectric material layer disposed on the IDT electrodes of the first and second SAW resonators, and a high velocity layer disposed within the dielectric material layer disposed on the IDT electrodes of the first SAW resonator, the second SAW resonator lacking a high velocity layer disposed within the dielectric material layer disposed on the IDT electrodes.

In some embodiments, the first SAW resonator exhibits a shear wave spurious mode having a resonance frequency above an anti-resonance frequency of a Rayleigh vibrational mode of the first SAW resonator.

In some embodiments, the first and second SAW resonators are electrically coupled to one another and are included in a ladder filter including at least one series SAW resonator electrically coupled in series between an input port and an output port of the ladder filter and at least one parallel SAW resonator electrically connected between a terminal of the at least one series SAW resonator and ground.

In some embodiments, the resonant frequency of the shear wave spurious mode occurs at a frequency outside a passband of the ladder filter.

In some embodiments, a cut angle of the piezoelectric substrate and a thickness of the dielectric material layer relative to the finger pitch of the first SAW resonator are selected to minimize an intensity of a shear wave at the resonance frequency of the shear wave spurious mode.

In some embodiments, the dielectric layer comprises silicon dioxide.

In some embodiments, the high velocity layer comprises one or more of silicon nitride, silicon oxynitride, aluminum nitride, aluminum oxide, or diamond.

In some embodiments, the dielectric layer of the first SAW resonator is split into an upper layer and a lower layer by the high velocity layer.

In some embodiments, the high velocity layer is located between about 0% and about 40% of the thickness of the dielectric material above the IDT electrodes of the first SAW resonator.

In some embodiments, the electronic device is included in an electronic device module. The electronic device module may be a radio frequency device module.

In accordance with another aspect, there is provided an electronic device. The electronic device comprises a first filter and a second filter, each including surface acoustic wave (SAW) resonators disposed on a same piezoelectric substrate, the first filter having a passband different than a passband of the second filter; a dielectric film covering the SAW resonators of the first and second filters, and a high velocity layer disposed within the dielectric film covering the SAW resonators of the first filter, the second filter including one or more SAW resonators lacking the high velocity layer.

In some embodiments, the dielectric film covering at least one of the SAW resonators of the first filter has a different thickness than the dielectric film covering at least one of the SAW resonators of the second filter.

In some embodiments, a normalized height of the high velocity layer within the dielectric film covering the at least one of the SAW resonators of the first filter is different from the normalized height of the high velocity layer within the dielectric film covering the at least one of the SAW resonators of the second filter.

In some embodiments, the high velocity layer disposed within the dielectric film covering the at least one of the SAW resonators of the first filter has a same thickness as the high velocity layer disposed within the dielectric film covering the at least one of the SAW resonators of the second filter.

In some embodiments, the high velocity layer disposed within the dielectric film covering the at least one of the SAW resonators of the first filter has a different thickness than the high velocity layer disposed within the dielectric film covering the at least one of the SAW resonators of the second filter.

In some embodiments, a normalized thickness of the high velocity layer within the dielectric film covering the at least one of the SAW resonators of the first filter is the same as the normalized thickness of the high velocity layer within the dielectric film covering the at least one of the SAW resonators of the second filter.

In some embodiments, the dielectric film covering the SAW resonators of the first filter includes an upper portion disposed on an upper surface of the high velocity layer and a lower portion disposed between a lower surface of the high velocity layer and upper surfaces of interdigital transducer electrodes of at least one of the SAW resonators of the first filter.

In some embodiments, a thickness of the lower portion of the dielectric film covering the at least one of the SAW resonators of the first filter has a different thickness than the lower portion of the dielectric film covering the at least one of the SAW resonators of the second filter.

In some embodiments, a normalized height of the high velocity layer within the dielectric film covering the at least one of the SAW resonators of the first filter is the same as the normalized height of the high velocity layer within the dielectric film covering the at least one of the SAW resonators of the second filter.

In some embodiments, a normalized thickness of the high velocity layer within the dielectric film covering the at least one of the SAW resonators of the first filter is different than the normalized thickness of the high velocity layer within the dielectric film covering the at least one of the SAW resonators of the second filter.

In some embodiments, a thickness of the high velocity layer within the dielectric film covering the at least one of the SAW resonators of the first filter has a different thickness than the high velocity layer within the dielectric film covering the at least one of the SAW resonators of the second filter.

In some embodiments, wherein a normalized thickness of the high velocity layer within the dielectric film covering the at least one of the SAW resonators of the first filter is the same as the normalized thickness the high velocity layer within the dielectric film covering the at least one of the SAW resonators of the second filter.

In some embodiments, at least one of the first filter or the second filter is a ladder filter including a plurality of series resonators and a plurality of parallel resonators, the high velocity layer being disposed within the dielectric film covering at least one of the plurality of series resonators and at least one of the plurality of parallel resonators.

In some embodiments, at least one of the first filter or the second filter is a multi-mode SAW filter.

In some embodiments, at least one of the first filter or the second filter is a dual mode SAW filter.

In some embodiments, the electronic device is included in an electronic device module. The electronic device module may be a radio frequency device module.

In accordance with another aspect, there is provided a surface acoustic wave (SAW) resonator. The SAW resonator comprises an interleaved interdigital transducer (IDT) electrode, a dielectric material layer disposed on the IDT electrode of the SAW resonator, and a high velocity layer disposed within the dielectric material layer disposed on the IDT electrode of the SAW resonator.

In some embodiments, the high velocity layer has dimensions sufficient to cause a temperature coefficient of frequency of a resonant frequency of the SAW resonator to be shifted closer to zero as compared to a substantially similar SAW resonator lacking the high velocity layer.

In some embodiments, the IDT electrode includes a stack of at least two layers, each of the layers including a different material.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments disclosed herein include filter structures for wireless communication devices, and methods of manufacturing same, that exhibit low levels of spurious shear modes within passbands of the filters. Specific embodiments include ladder filter structures including acoustic wave elements with dielectric coatings having compositions and thicknesses selected to achieve a desired parameters, for example, temperature coefficient of frequency, quality factor, and coupling coefficient, and minimal spurious shear modes within passbands of the filters.

Aspects and embodiments disclosed herein include RF filters built on a piezoelectric substrate, for example, LiNbO$_3$ or LiTaO$_3$ and exhibiting a ladder structure including series and parallel resonators. The resonators may include surface acoustic wave (SAW) resonators including interleaved interdigital transducer (IDT) electrodes that are covered by a dielectric film, for example, SiO$_2$ or a combination of dielectric films, for example, SiO$_2$ and Si$_3$N$_4$.

Figure 1:
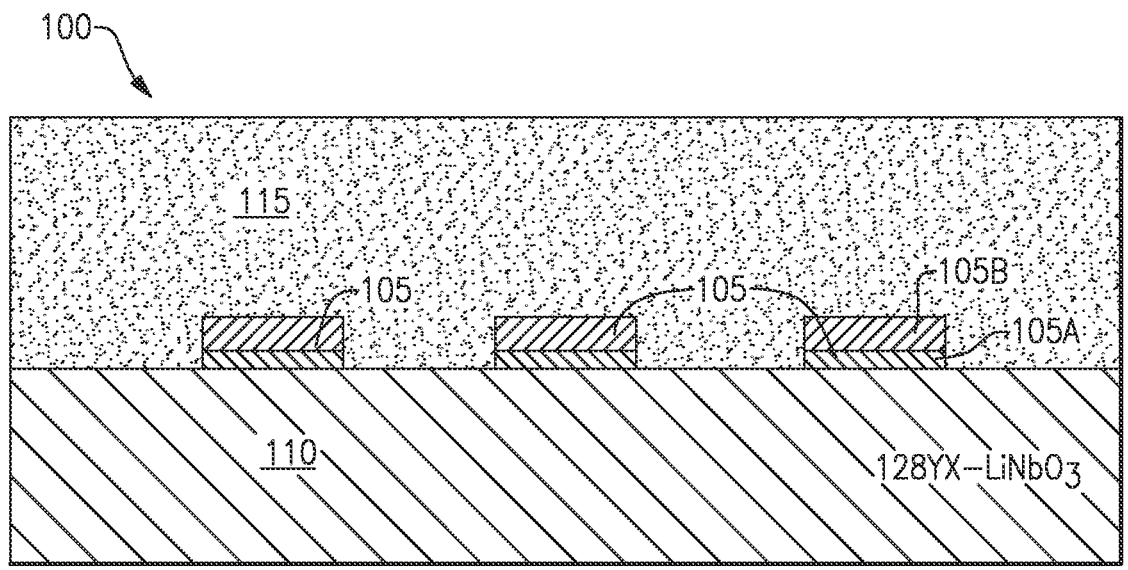
FIG. 1 is a cross-sectional view of a portion of a surface acoustic wave (SAW) resonator.

A simplified cross sectional view of an embodiment of a SAW resonator is presented in FIG. 1, indicated generally at 100. The SAW resonator 100 includes a plurality of IDT electrodes 105 disposed on a piezoelectric substrate 110. The piezoelectric substrate 110 may consist of or comprise, for example, LiNbO$_3$, LiTaO$_3$, or another piezoelectric material. In the specific embodiment illustrated in FIG. 1, the piezoelectric substrate 110 is 128YX cut LiNbO$_3$. The plurality of IDT electrodes 105 and the piezoelectric substrate 110 are covered by a layer of dielectric material 115, for example, silicon dioxide (SiO$_2$). In any of the embodiments disclosed herein, the layer of dielectric material 115 may be covered by a second layer of dielectric material, for example, silicon nitride (Si$_3$N$_4$) that may provide for passivation and frequency trimming of the SAW resonator 100. This second layer of dielectric material is omitted from the figures for sake of simplicity. The IDT electrodes 105 are illustrated in FIG. 1 as including a lower layer 105A and an upper layer 105B. The lower layer 105A may include or consist of, for example, tungsten or molybdenum and the upper layer 105B may include or consist of, for example, aluminum. Although the IDT electrodes illustrated in the other figures of this application are illustrated as including a single material layer for simplicity, is to be appreciated that the IDT electrodes in any of the embodiments disclosed herein may be formed of a single material or of multiple layers of different materials.

Figure 2:
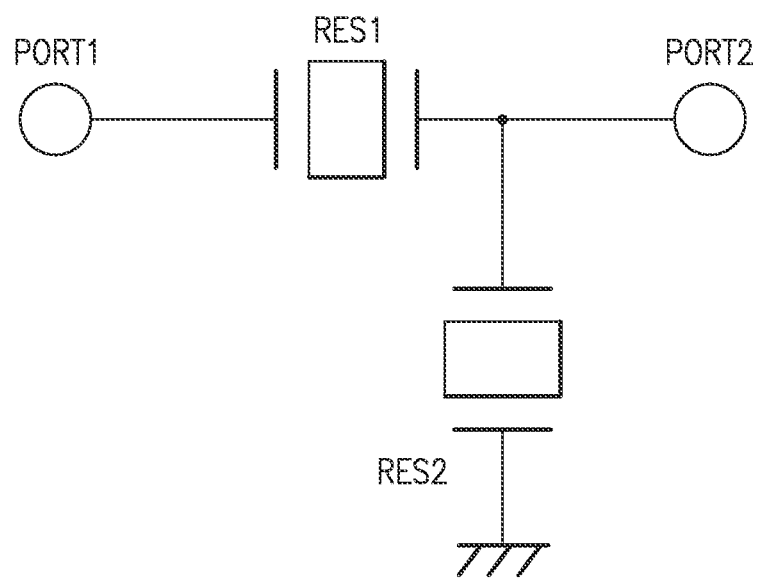
FIG. 2 is a schematic view of a portion of a ladder filter.

Multiple SAW resonators may be assembled together to form a ladder filter. An embodiment of a portion of a ladder filter is illustrated in FIG. 2. The portion of the ladder filter includes a single series resonator Res1 positioned in series between input and output ports Port1 and Port2 of the portion of the ladder filter and a single parallel resonator Res2 electrically connected in parallel between a terminal of the series resonator Res1 and ground. The resonators Res1 and Res2 may have different resonance and antiresonance frequencies, with series resonator Res1 typically having a higher resonance frequency that the resonance frequency of parallel resonator Res2 as well as a higher anti-resonance frequency than the anti-resonance frequency of parallel resonator Res2.

Figure 3:
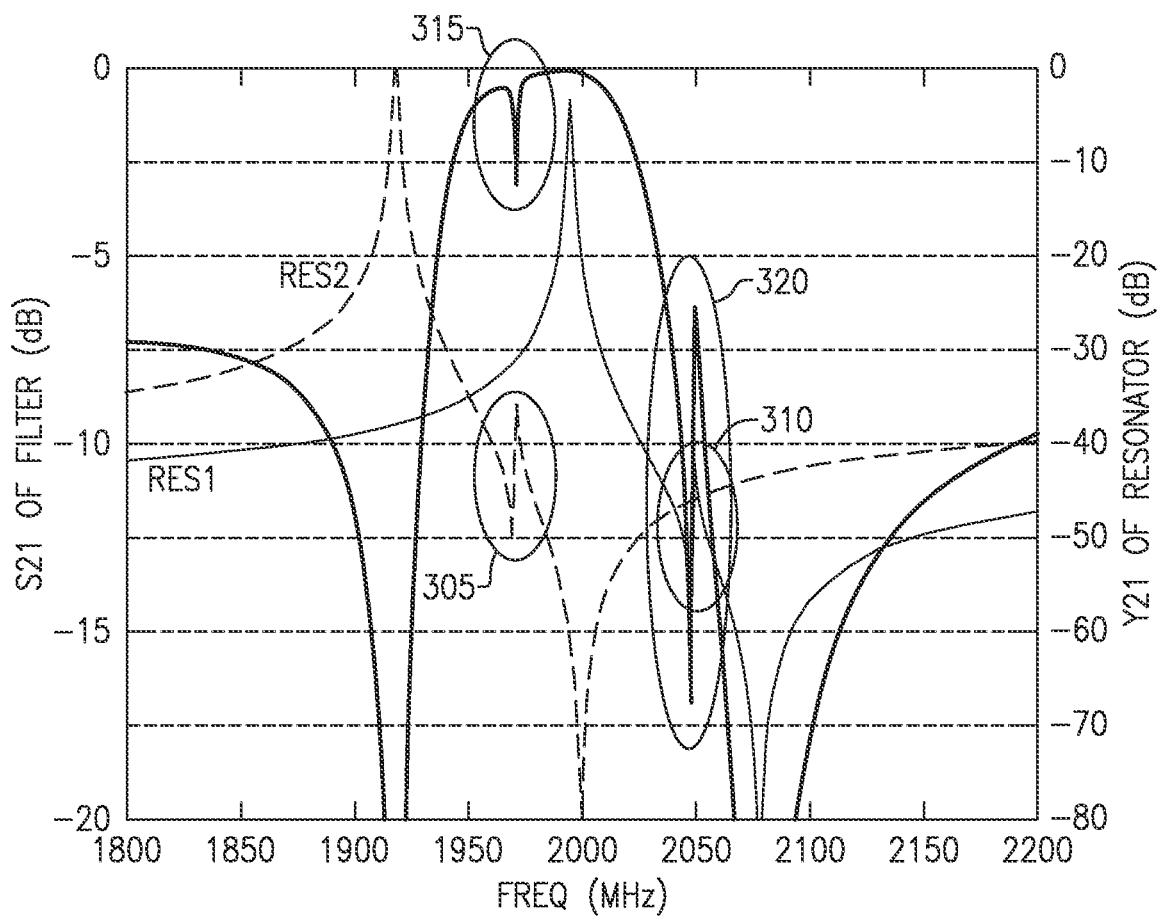
FIG. 3 illustrates frequency response of parameters of the ladder filter of FIG. 2.

A simulation of the performance of the resonators Res1 and Res2 and of the portion of the ladder filter is illustrated in FIG. 3. The curves of the impedance parameters Y21 of the longitudinal wave (Rayleigh) vibrational modes of the resonators Res1 and Res2 exhibit discontinuities, indicated at 305 and 310, due to the presence of shear wave vibrational modes generated during operation. The discontinuities in the impedance parameter curves of the resonators Res1 and Res2 lead to discontinuities, indicated at 315 and 320, in the transmission parameter S21 from Port1 to Port2 of the ladder filter. Discontinuities 315 and 320 are undesirable in that they degrade performance of the ladder filter.

Figure 4:
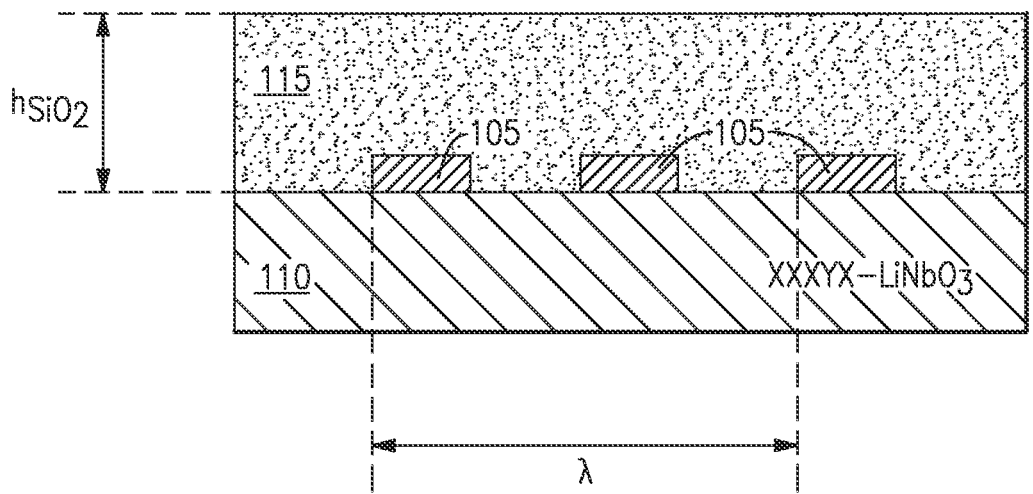
FIG. 4 illustrates design parameters of a SAW resonator.

Various parameters of SAW resonators that may be adjusted include the spacing between the IDT electrodes 105, which in turn defines the wavelength λ of the resonant frequency of the resonator, the thickness $h_{SiO2}$ of the dielectric layer 115, and the cut angle of the piezoelectric crystal substrate. These parameters are illustrated in FIG. 4, with the cut angle of the piezoelectric crystal substrate designated as "xxx".

Figure 5:
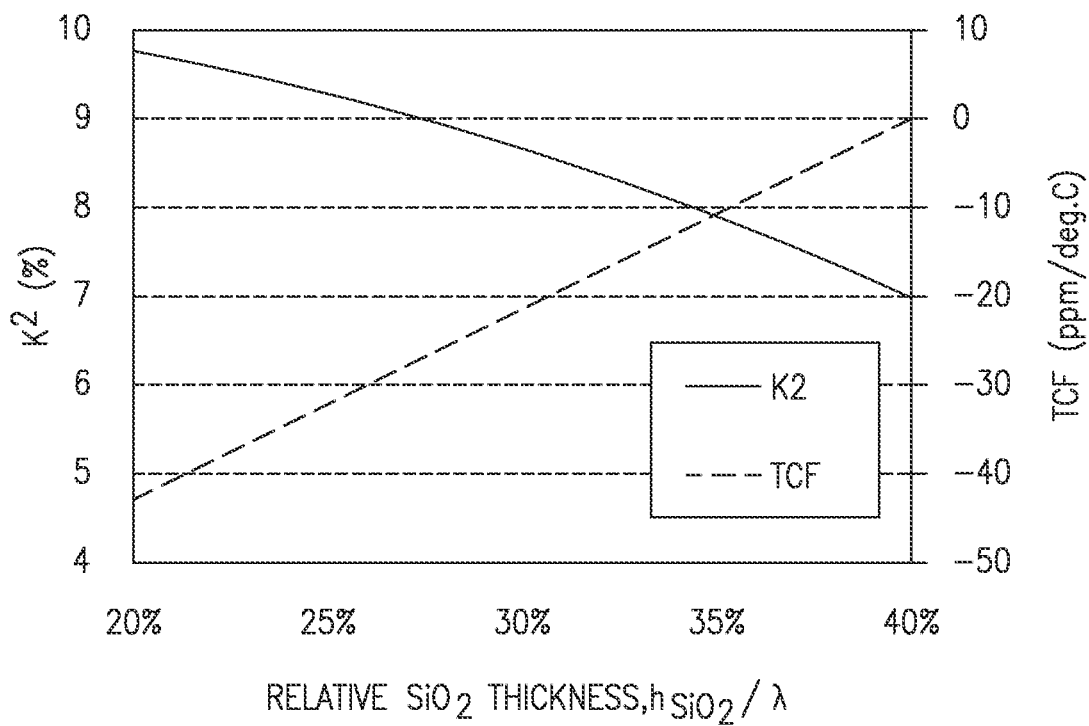
FIG. 5 illustrates change in coupling coefficient ($k^2$) and temperature coefficient of frequency (TCF) with change in a dielectric layer thickness in an embodiment of a SAW resonator.
Figure 6:
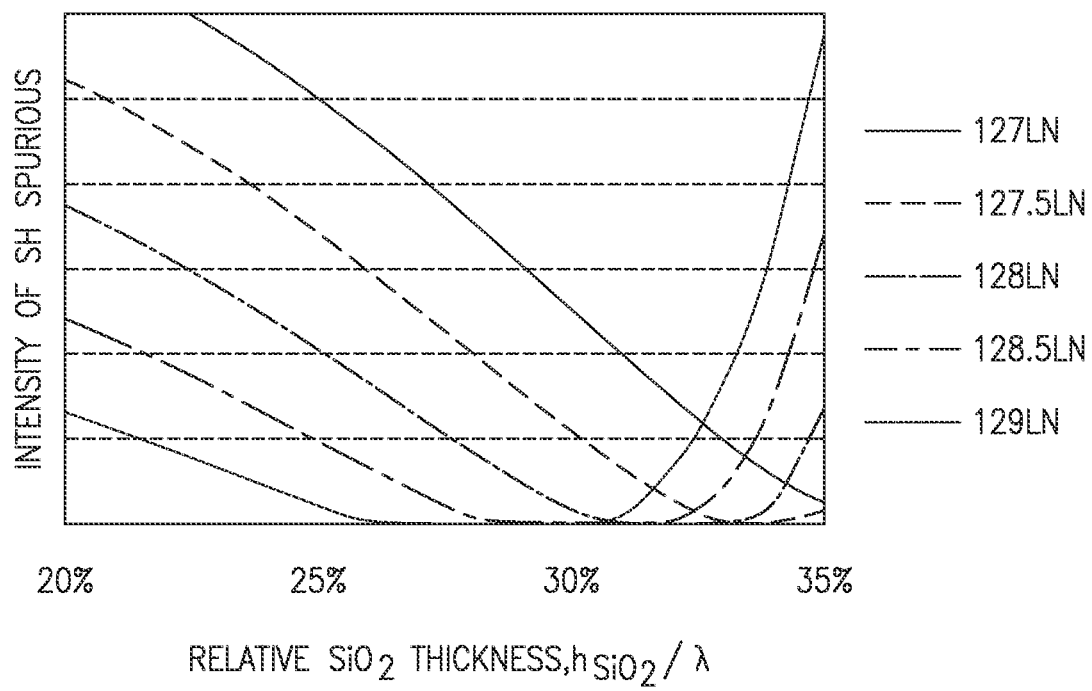
FIG. 6 illustrates change in intensity of shear mode spurious signals with change in a dielectric layer thickness and piezoelectric substrate cut angle in an embodiment of a SAW resonator.

The thickness $h_{SiO2}$ of the dielectric layer 115 affects the temperature coefficient of frequency (TCF) of a SAW resonator and the coupling coefficient k$^2$ between the IDT electrodes 105 and the piezoelectric substrate 110 as illustrated in FIG. 5. The relative thickness $h_{SiO2}/\lambda$ of the dielectric layer 115 is thus typically selected to achieve desired values for these parameters in a SAW resonator. Once the relative thickness $h_{SiO2}/\lambda$ of the dielectric layer 115 is selected, the cut angle xxx of the piezoelectric crystal substrate may be selected to minimize the intensity of the shear wave spurious signal. As illustrated in FIG. 6 a cut angle of 129 degrees may be selected to minimize shear wave spurious signals in an embodiment of a SAW resonator having a relative thickness $h_{SiO2}/\lambda$ of the dielectric layer of between 25% and 30%, whereas a shallower cut angle, for example, of about 127 degrees may be appropriate for suppressing shear wave spurious signals in an embodiment of a SAW resonator having a relative thickness $h_{SiO2}/\lambda$ of the dielectric layer of greater than about 35%.

Figure 7:
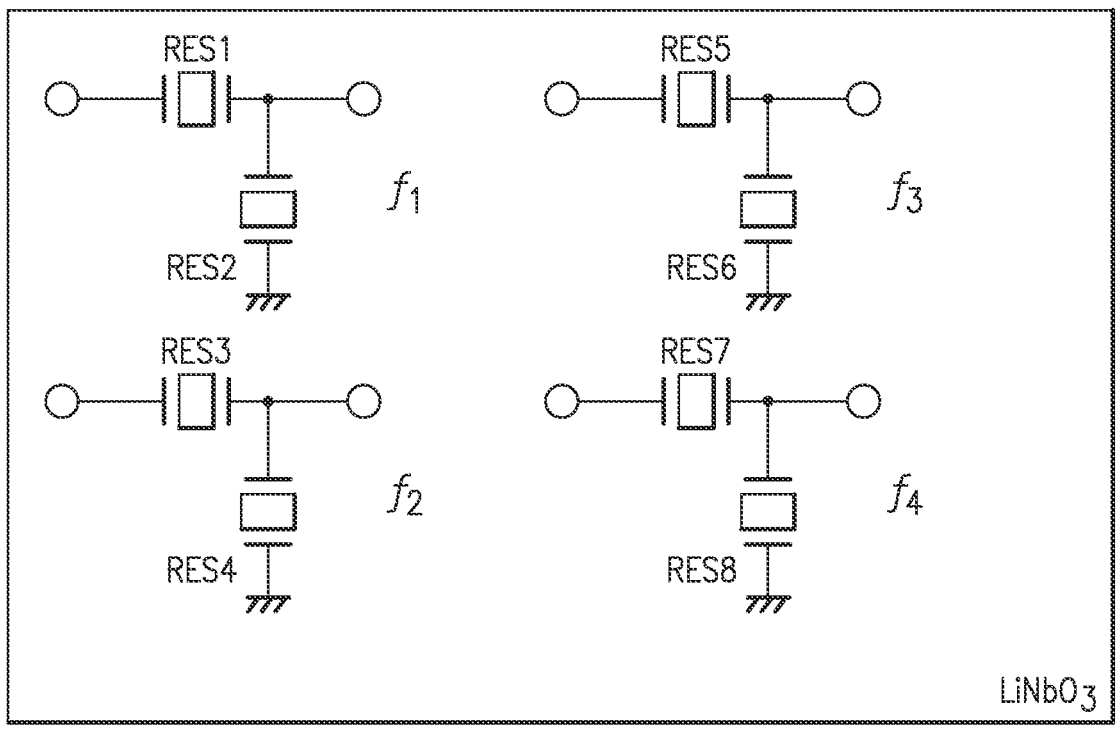
FIG. 7 schematically illustrates an embodiment of an integrated circuit including a plurality of ladder filters including SAW resonators formed on a common piezoelectric substrate.

In some embodiments, for example, as illustrated schematically in FIG. 7, multiple filter portions, indicated as filter portions $f_1$, $f_2$, $f_3$, and $f_4$, having different resonators Res1-Res8 with different resonant frequencies (and thus different $\lambda$ parameters) may be formed in a single chip on a common piezoelectric substrate. Because the $\lambda$ parameters of the different resonators of the different filter portions $f_1$, $f_2$, $f_3$, and $f_4$ may be different, a different thickness $h_{SiO2}$ of the dielectric layers covering the IDT electrodes of the different filter portions may be desired to obtain relative thicknesses $h_{SiO2}/\lambda$ of the dielectric layers of each resonator of the filter portions to provide a desired TCF and $k^2$ for each resonator of each filter portion. The formation of regions of the dielectric layer 115 with different thicknesses in locations corresponding to the different resonators presents a manufacturing challenge. Further, once the relative thicknesses $h_{SiO2}/\lambda$ of the dielectric layers for each of the resonators is selected, the cut angle of the piezoelectric crystal substrate may not be separately selected for each of the resonators to suppress the spurious shear wave signals in each of the filter portions because the filter portions are each formed on the same substrate.

Figure 8:
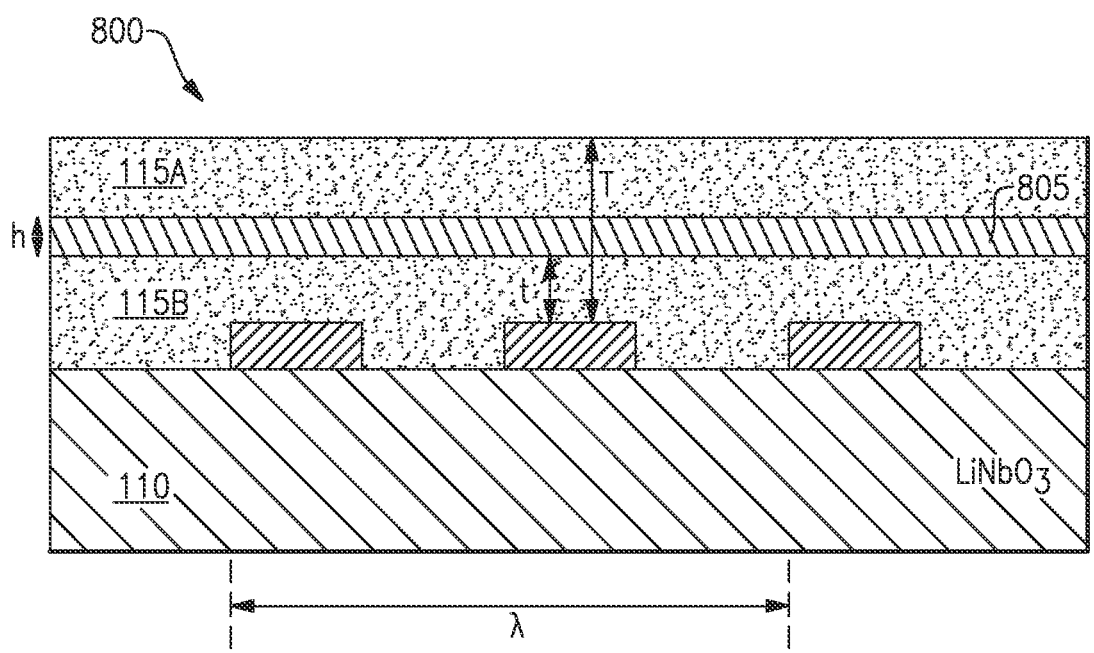
FIG. 8 is a cross-sectional view of a portion of a SAW resonator including a dielectric film layer and a high velocity layer disposed within the dielectric film layer.

It has been discovered that by adding a layer of a material having a higher acoustic velocity than the dielectric material within the dielectric layer 115, the frequency at which the discontinuity in the impedance parameter curve of a SAW resonator occurs due to the generation of shear wave spurious modes may be shifted. The layer of material having the higher acoustic velocity than the dielectric layer 115 may be referred to as a "high velocity layer." An example of inclusion of a high velocity layer 805 in an embodiment of a SAW resonator, indicated generally at 800, is illustrated in FIG. 8. In embodiments where the dielectric layer 115 is SiO$_2$, the high velocity layer 805 may include or consist of Si$_3$N$_4$, silicon oxynitride (SiO$_x$N$_y$), aluminum nitride (AlN), aluminum oxide (Al$_2$O$_3$), diamond, or other materials having a higher acoustic velocity than SiO$_2$ known in the art. The thickness of the high velocity layer 805 is indicated as h in FIG. 8 and the relative thickness of the high velocity layer 805 is referred to as h/$\lambda$ herein.

In embodiments where the dielectric layer 115 is split into an upper portion 115A and a lower portion 115B by the high velocity layer 805 the sum of the thicknesses of the upper and lower portions 115A, 115B is considered the thickness $h_{SiO2}$ of the dielectric layer 115. In embodiments where the dielectric layer 115 is split into an upper portion 115A and a lower portion 115B by the high velocity layer 805 the upper portion 115A and lower portion 115B are collectively referred to herein as the dielectric layer 115. The presence of the high velocity layer 805 may have an impact upon the TCF and $k^2$ parameters of a resonator with a dielectric layer 115 having a relative thickness $h_{SiO2}/\lambda$ as compared to the resonator having the same relative thickness $h_{SiO2}/\lambda$ but without the high velocity layer 805. Accordingly, in embodiments in which a high velocity layer 805 is added to the dielectric layer 115 of a resonator having a relative thickness $h_{SiO2}/\lambda$ to achieve desired TCF and $k^2$ parameters, the relative thickness $h_{SiO2}/\lambda$ of the dielectric layer 115 may be adjusted to compensate for an impact of the high velocity layer 805 on the TCF and $k^2$ parameters.

Figure 9A:
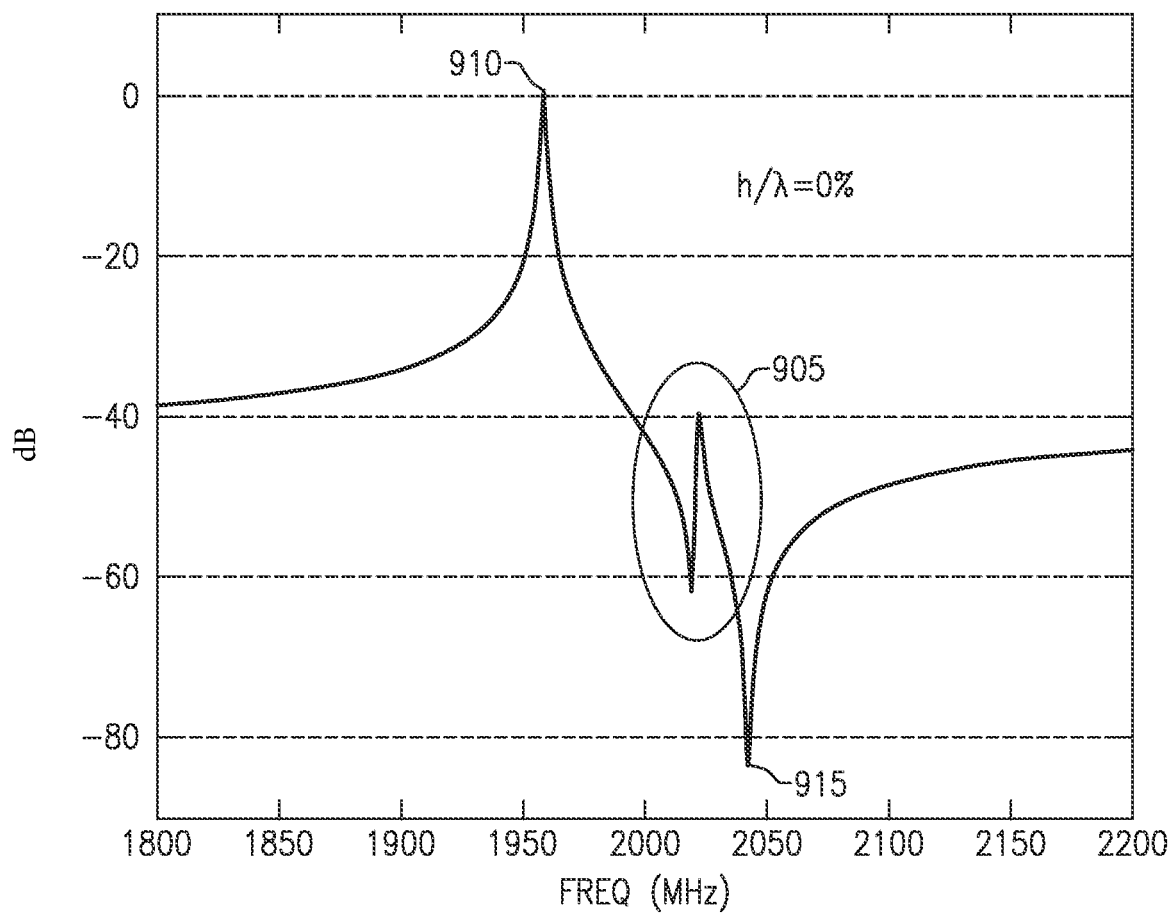
FIG. 9A illustrates the location of a shear mode spurious signal in an impedance parameter curve of a SAW resonator lacking a high velocity layer within a dielectric film layer of the SAW resonator.
Figure 9B:
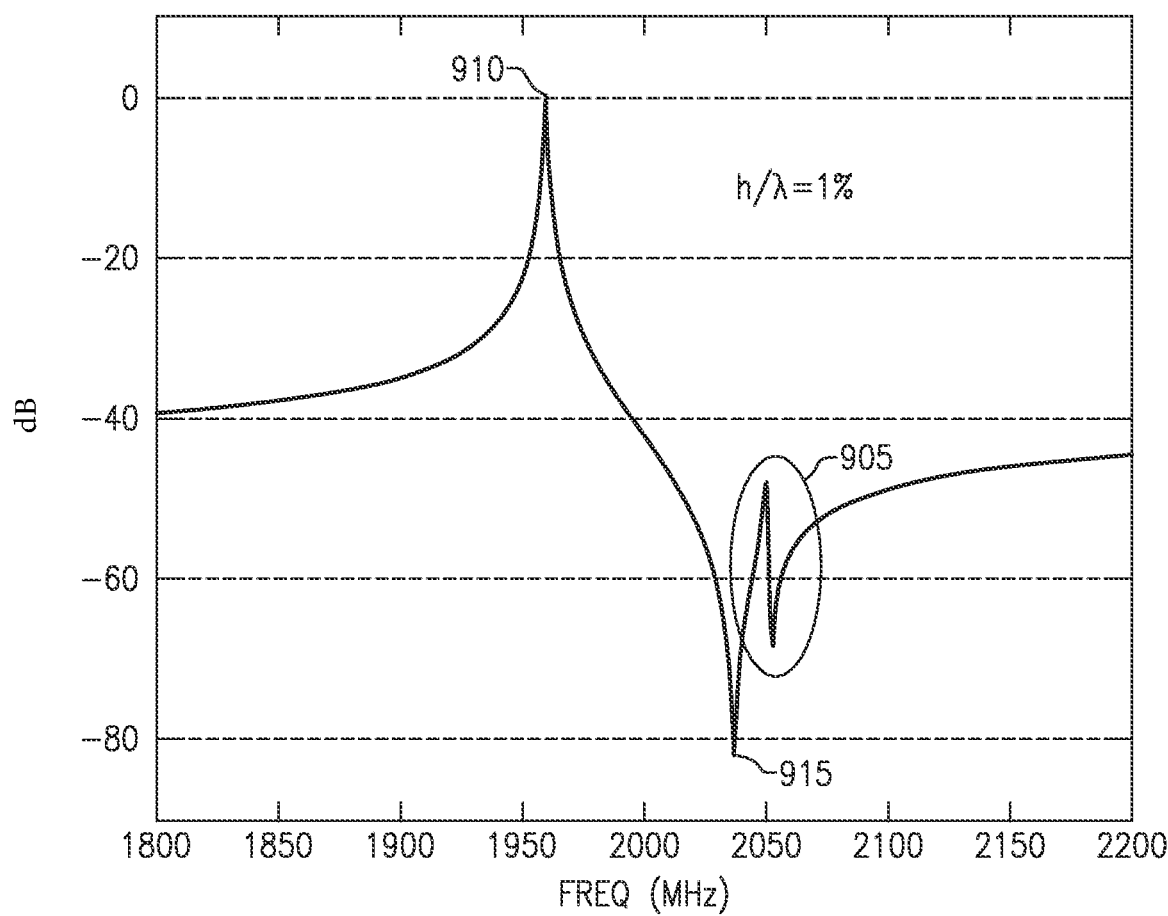
FIG. 9B illustrates the location of a shear mode spurious signal in an impedance parameter curve of a SAW resonator having a high velocity layer with a first thickness within a dielectric film layer of the SAW resonator.
Figure 9C:
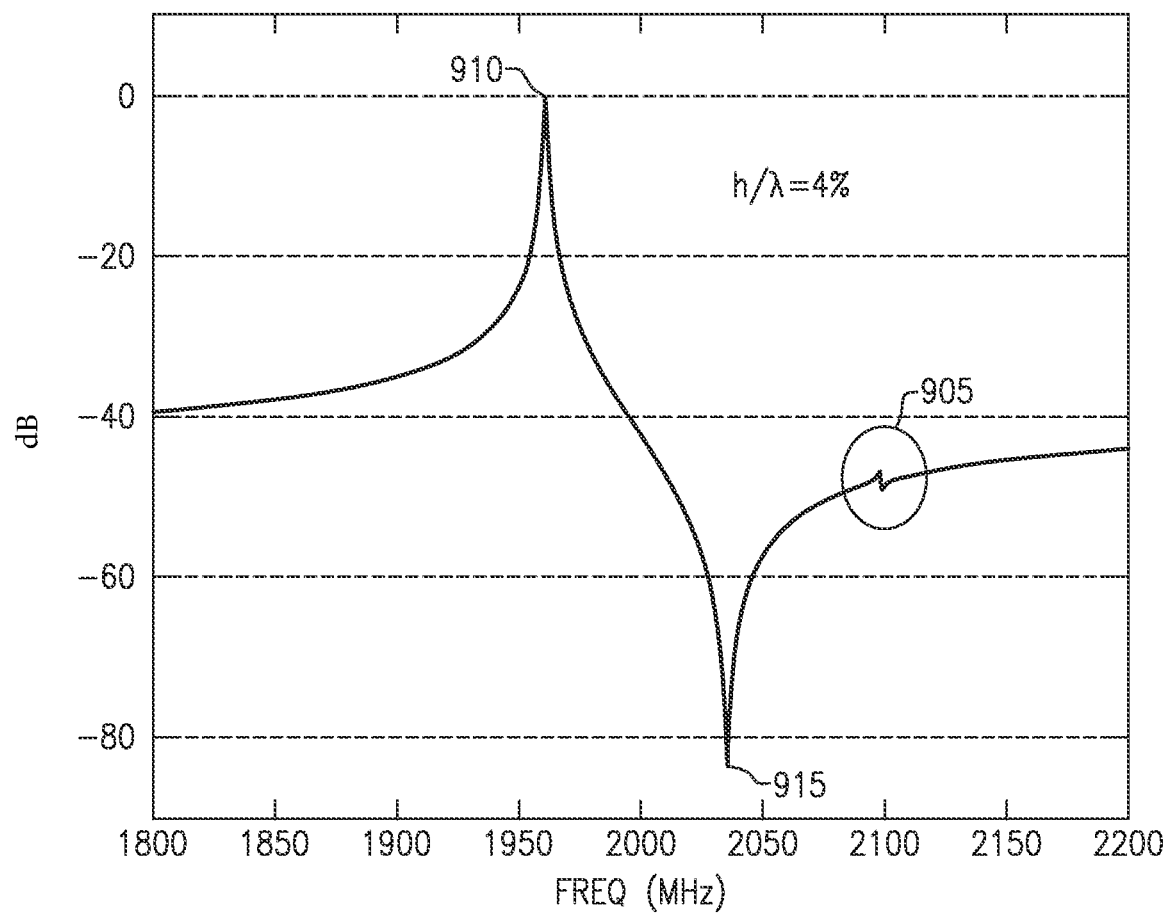
FIG. 9C illustrates the location of a shear mode spurious signal in an impedance parameter curve of a SAW resonator having a high velocity layer with a second thickness within a dielectric film layer of the SAW resonator.

The impact of including the high velocity layer 805 in the dielectric layer 115 of a resonator as illustrated in FIG. 8 is shown in FIGS. 9A-9C. FIG. 9A illustrates the impedance parameter Y21 curve of the resonator with no high velocity layer (a relative thickness h/$\lambda$ of zero). A discontinuity 905 in the impedance parameter curve is readily apparent between the resonance and antiresonance frequencies 910, 915 of the resonator. FIG. 9B illustrates the impact of adding a high velocity layer 805 having a relative thickness h/$\lambda$ of 1% in the dielectric layer 115 of a resonator as illustrated in FIG. 8. The addition of the high velocity layer 805 shifts the discontinuity 905 in the impedance parameter curve above the antiresonance frequency 915 and also decreases the magnitude of the discontinuity 905 as compared to that illustrated in FIG. 9A. FIG. 9C illustrates the impact of adding a high velocity layer 805 having a relative thickness h/$\lambda$ of 4% in the dielectric layer 115 of a resonator as illustrated in FIG. 8. The discontinuity 905 in the impedance parameter curve is shifted further upward and further decreased in magnitude as compared to that illustrated in FIG. 9B.

Figure 10:
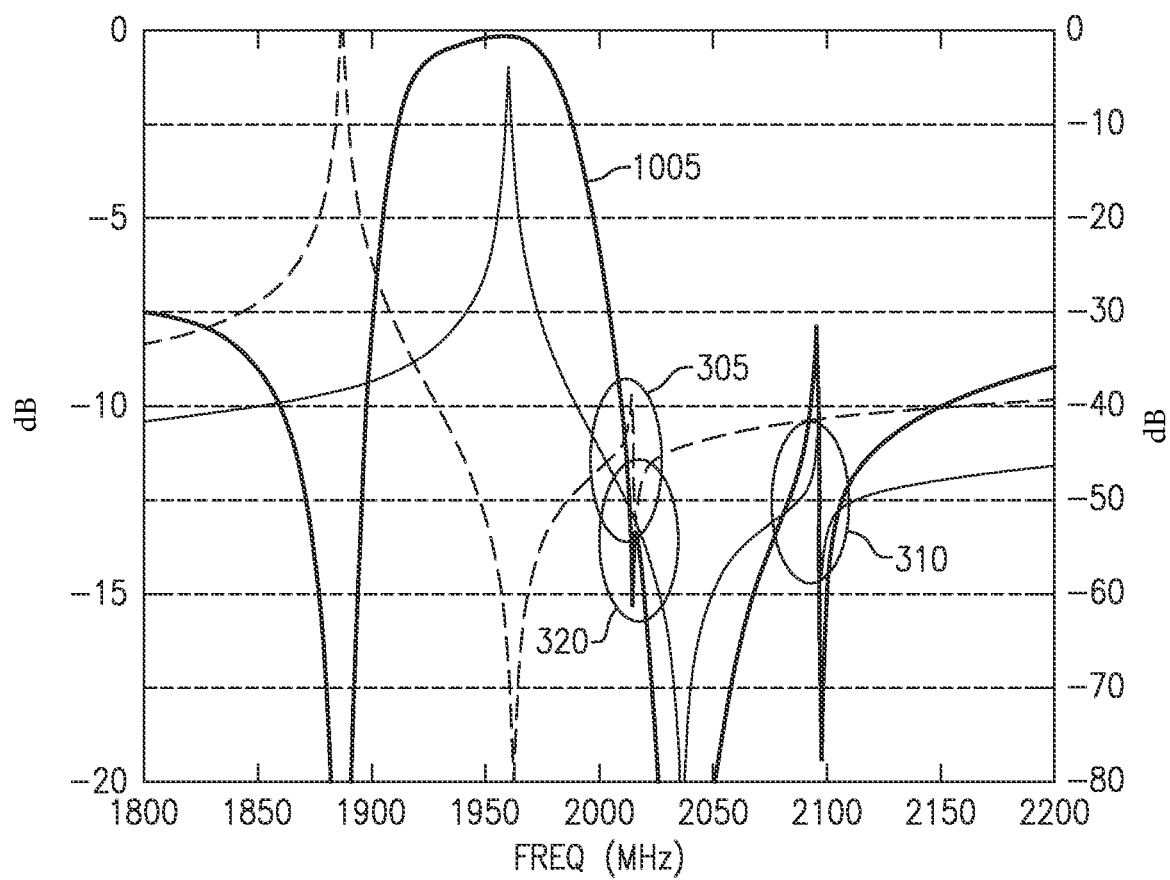
FIG. 10 illustrates frequency response of parameters of a ladder filter including resonators including dielectric film layers and high velocity layers disposed within the dielectric film layers.

FIG. 10 illustrates the impact on filter performance of a filter similar to that illustrated in FIG. 2 when a high velocity layer 805 is included in the dielectric layers 115 of the resonators of the filter as illustrated in FIG. 8. Comparing the transmission parameter curve 1005 illustrated in FIG. 10 to that illustrated in FIG. 3, it is apparent that due to the shifts in the frequencies at which the discontinuities 305, 310 in the impedance parameter curves of the resonators occur, the discontinuity in the impedance parameter curve indicated at 315 in FIG. 3 has been eliminated and the discontinuity indicated at 320 in FIG. 3 has been significantly reduced in magnitude and well as shifted in frequency to as to be effectively out of the passband of the filter.

Figure 11:
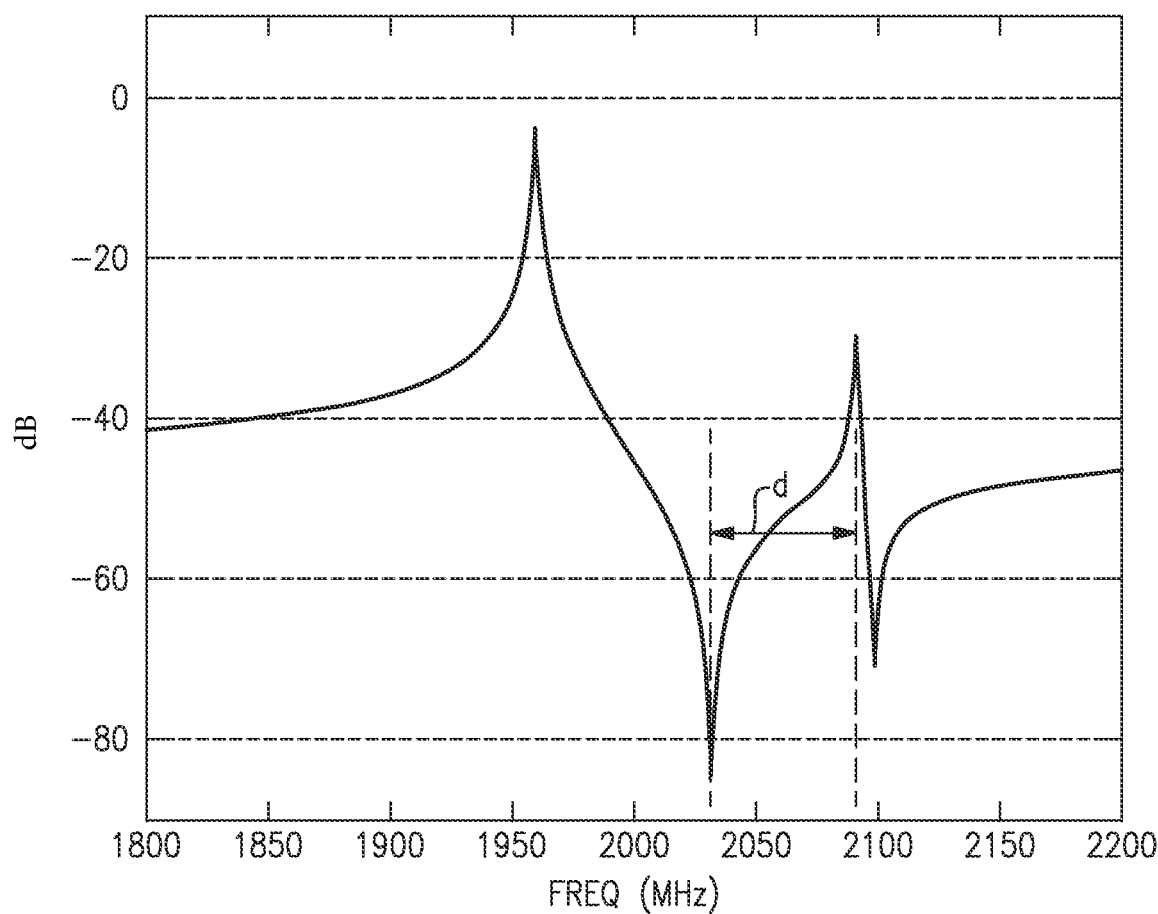
FIG. 11 illustrates difference in frequency between an antiresonant frequency of a longitudinal vibration mode and a shear mode spurious signal in an impedance parameter curve of a SAW resonator.
Figure 12:
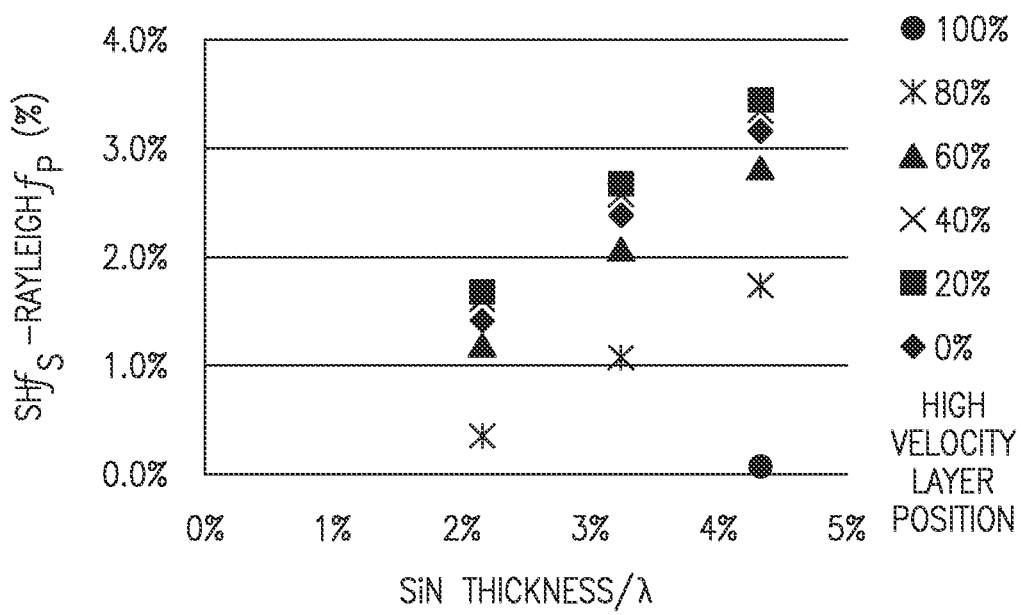
FIG. 12 illustrates difference between an antiresonant frequency of a longitudinal vibration mode and frequency of a shear mode spurious signal in an impedance parameter curve of a SAW resonator with a change in high velocity layer thickness and position of the high velocity layer within a dielectric film of the SAW resonator.
Figure 13A:
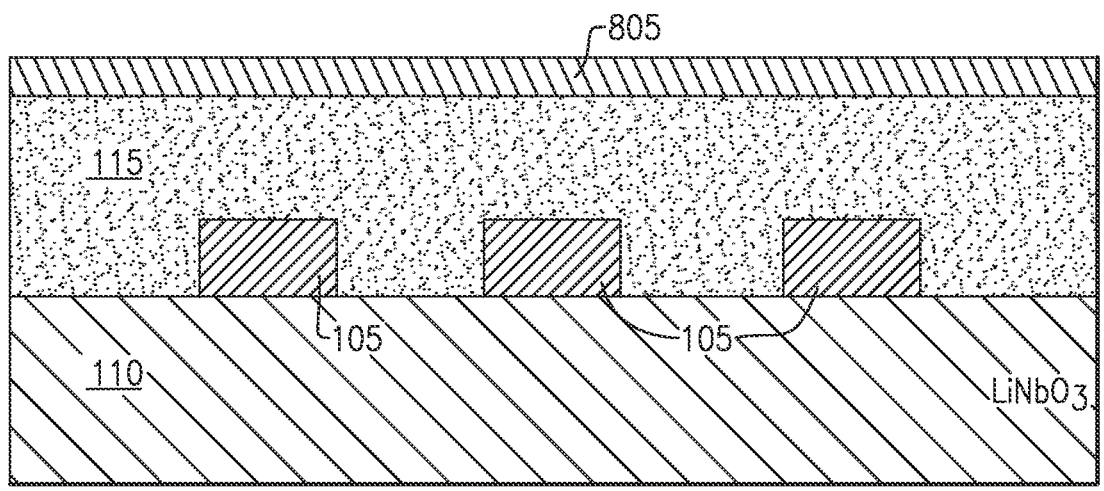
FIG. 13A is a cross-sectional view of a portion of a SAW resonator including a dielectric film layer and a high velocity layer disposed at a first location within the dielectric film layer.
Figure 13B:
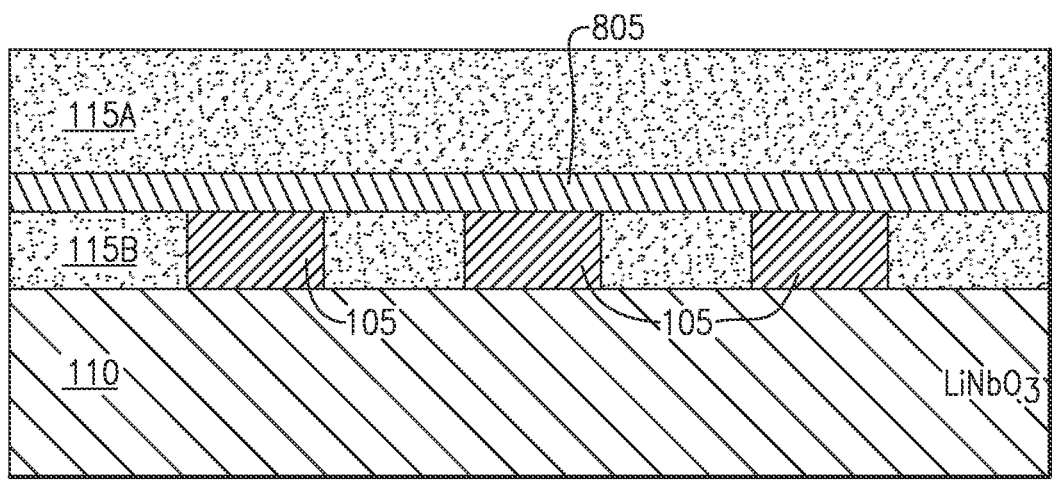
FIG. 13B is a cross-sectional view of a portion of a SAW resonator including a dielectric film layer and a high velocity layer disposed at a second location within the dielectric film layer.

Returning to FIGS. 9A-9C, the discontinuity 905 in the longitudinal mode impedance parameter curve of a resonator may correspond to a resonance in a shear wave vibration mode in the resonator. As illustrated in FIG. 10, performance of a ladder filter including SAW resonators may be improved by increasing the frequency difference between the antiresonance frequencies of the longitudinal wave vibration modes (Rayleigh mode) of the resonators and the resonance frequencies of the shear wave vibration modes of the resonators. This frequency difference is illustrated as frequency difference d in FIG. 11. The frequency difference d may be a function of both thickness of the high velocity layer 805 and position of the high velocity layer 805 in the dielectric layer 115 of a resonator. For example, as illustrated in FIG. 12 the frequency difference d (the "SH $f_s$-Rayleigh $f_p$" parameter in FIG. 12) increases with relative thickness h/$\lambda$ of the high velocity layer 805 (the "SiN thickness/$\lambda$" parameter in FIG. 12). In some embodiments, the relative thickness h/$\lambda$ of the high velocity layer 805 is between about 0.1% and about 5%. The frequency difference d also generally increases as a position of the high velocity layer 805 in the dielectric layer 115 decreases, although the frequency difference d decreases somewhat as the position of the high velocity layer 805 in the dielectric layer 115 decreases from 20% of the thickness of the dielectric layer 115 to 0%. The position of the high velocity layer 805 in the dielectric layer 115 is described herein as a percentage thickness of the dielectric layer 115 disposed below the lower surface of the high velocity layer 805—the ratio between the distances t/T illustrated in FIG. 8. The meaning of the percentage thicknesses of the dielectric layer 115 at which the high velocity layer 805 is located is further illustrated in FIGS. 13A and 13B. A position at 100% of the thickness of the dielectric layer 115 is a position on top of the entirety of the dielectric layer 115 as illustrated in FIG. 13A. A position at 0% of the thickness of the dielectric layer 115 is a position directly on top of the IDT electrodes 105 in the dielectric layer 115 as illustrated in FIG. 13B.

Figure 14:
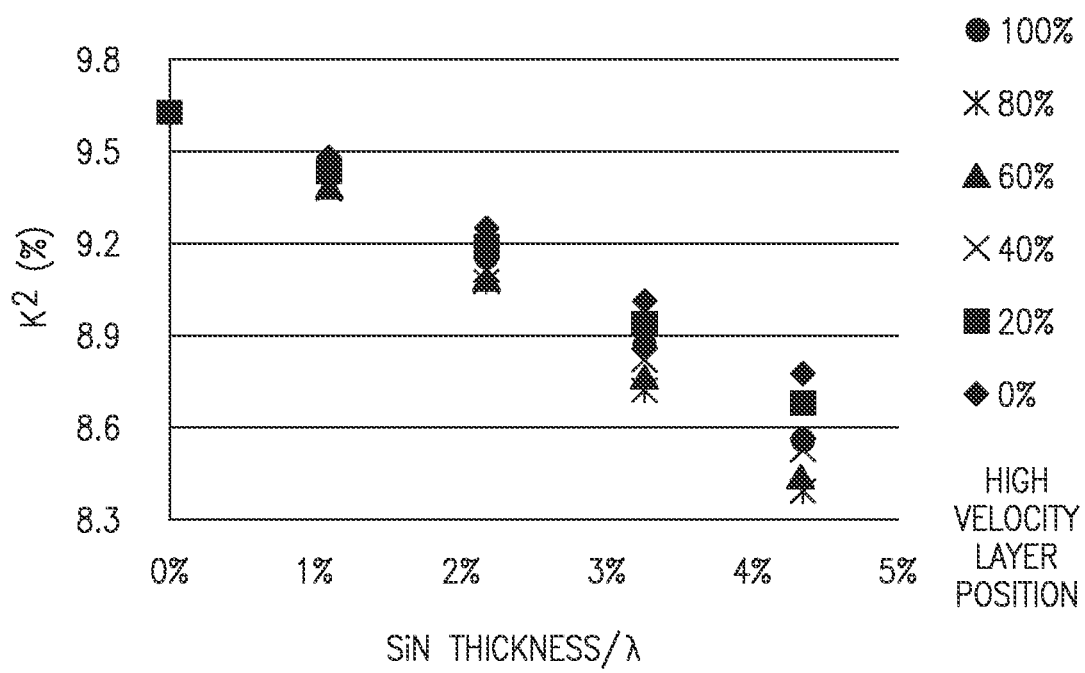
FIG. 14 illustrates change in coupling coefficient ($k^2$) in an impedance parameter curve of a SAW resonator with a change in high velocity layer thickness and position of the high velocity layer within a dielectric film of the SAW resonator.

The coupling coefficient $k^2$ and the quality factor Q of a resonator may also be dependent on the thickness and location of the high velocity layer 805 in the dielectric layer 115. As illustrated in FIG. 14, the coupling coefficient $k^2$ of a resonator may decrease with increasing relative thickness (SiN thickness/$\lambda$) of the high velocity layer 805 and increase with a decreasing height of the location of the high velocity layer 805 in the dielectric layer 115. Similarly, as illustrated in FIG. 15, the quality factor (Q) of a resonator may decrease with increasing relative thickness (SiN thickness/$\lambda$) of the high velocity layer 805 and increase with a decreasing height of the location of the high velocity layer 805 in the dielectric layer 115.

Figure 15:
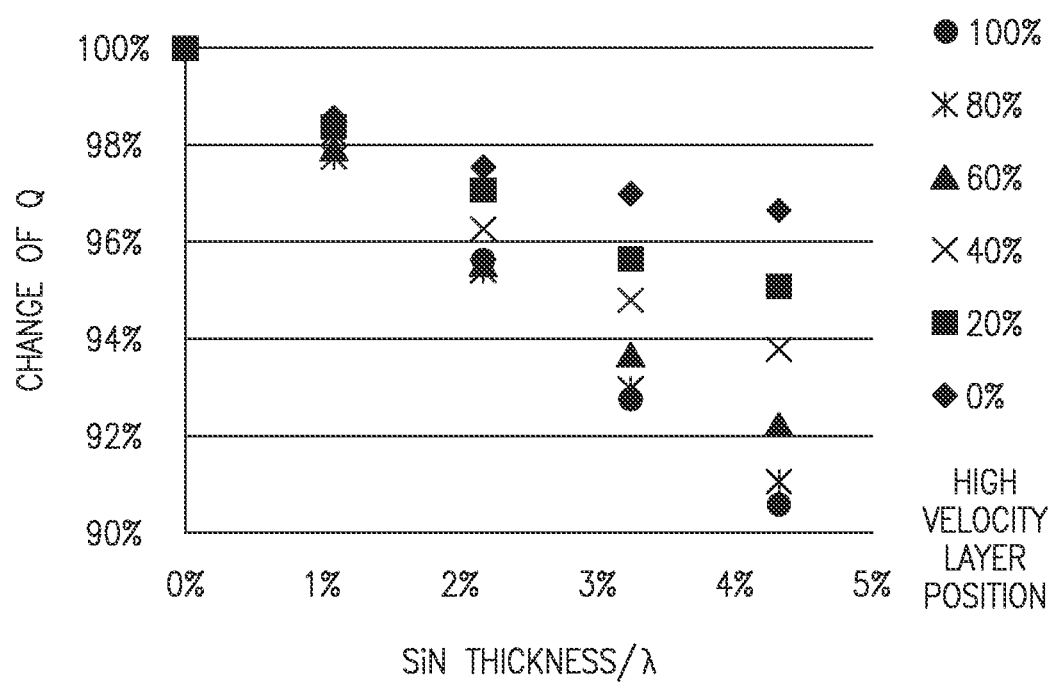
FIG. 15 illustrates change in quality factor in an impedance parameter curve of a SAW resonator with a change in high velocity layer thickness and position of the high velocity layer within a dielectric film of the SAW resonator.

In view of the relationships illustrated in FIGS. 12, 14, and 15, desirable resonator parameters may be achieved when the height of the location of the high velocity layer 805 in the dielectric layer 115 is less than about 40% of the thickness of the dielectric layer 115 but more than about 2% of the thickness of the dielectric layer 115 above the top of the IDT electrodes 105. The relative thickness $h/\lambda$ (or SiN thickness/$\lambda$ as illustrated in FIGS. 12, 14, and 15) of the high velocity layer 805 may be selected to achieve a desired balance between the frequency difference between the anti-resonance frequency of the longitudinal wave vibration mode (Rayleigh mode) of a resonator and the resonance frequency of the shear wave vibration mode, quality factor of the resonator, and coupling coefficient of the resonator.

Figure 16A:
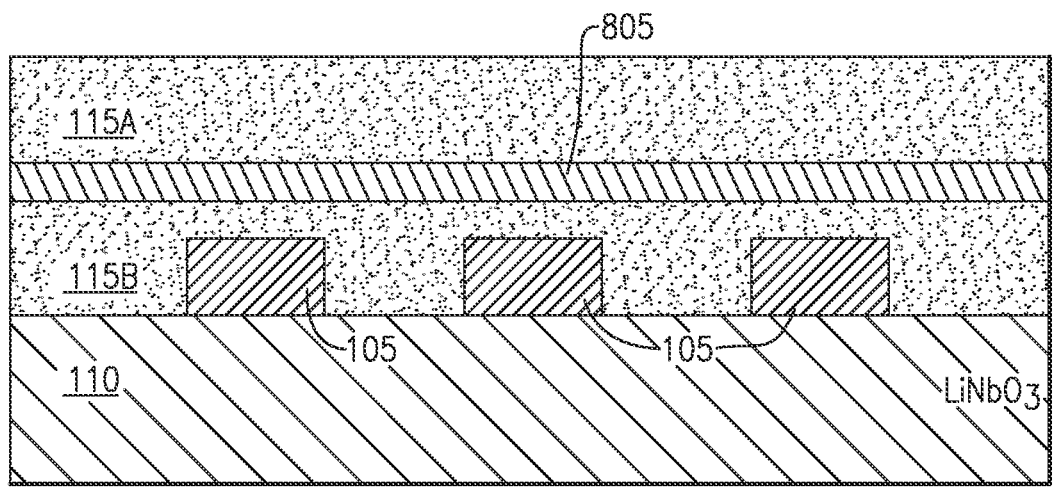
FIG. 16A is a cross-sectional view of a portion of a SAW resonator having a dielectric layer and a high velocity layer disposed in the center of the dielectric layer.
Figure 16B:
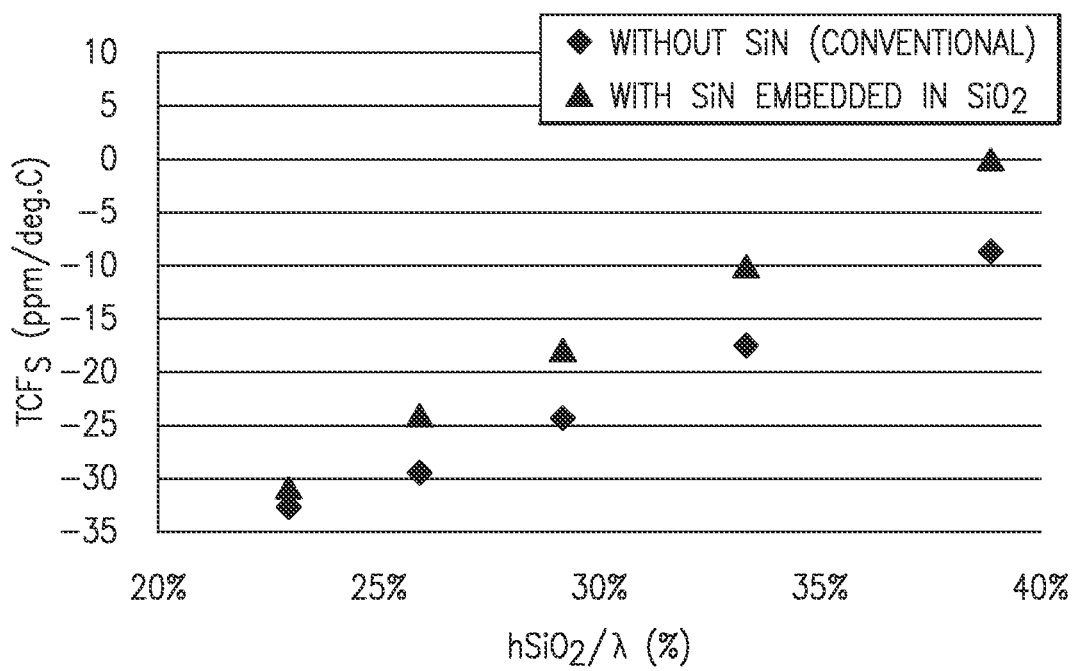
FIG. 16B illustrates change in TCF of the resonant frequency of a longitudinal vibration mode of the resonator of FIG. 16A with change in dielectric layer thickness.
Figure 16C:
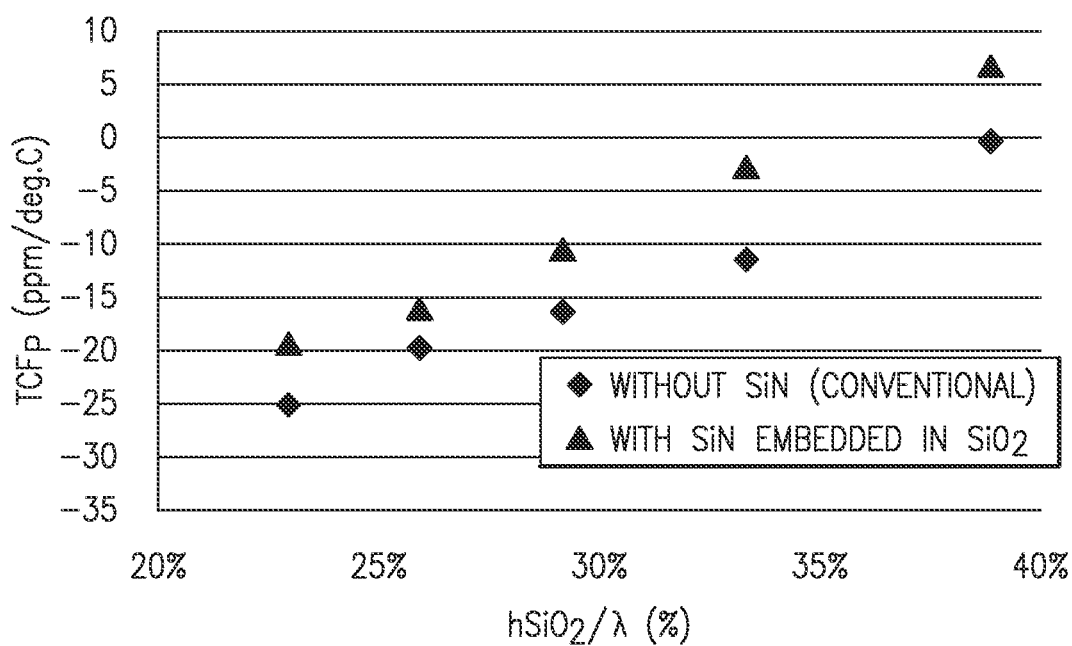
FIG. 16C illustrates change in TCF of the antiresonant frequency of a longitudinal vibration mode of the resonator of FIG. 16A with change in dielectric layer thickness.

A change in the TCF of the resonance frequency with a change in relative dielectric layer thickness $h_{SiO2}/\lambda$ of a resonator having a high velocity layer 805 disposed within the dielectric layer 115, as illustrated in FIG. 16A, is illustrated in FIG. 16B. The dielectric layer thickness $h_{SiO2}$ is the sum of the thickness of the upper portion 115A of the dielectric film 115 and the thickness of the lower portion 115B of the dielectric film 115. The change in TCF of the resonance frequency with a change in relative dielectric layer thickness $h_{SiO2}/\lambda$ for a resonator similar to that of FIG. 16A but without a high velocity layer 805 disposed in the dielectric layer 115 is also illustrated in FIG. 16B for comparison. A change in the TCF of the antiresonance frequency of the resonator of FIG. 16A with a change in relative dielectric layer thickness $h_{SiO2}/\lambda$ is illustrated in FIG. 16C. The change in TCF of the antiresonance frequency with a change in relative dielectric layer thickness $h_{SiO2}/\lambda$ for a resonator similar to that of FIG. 16A but without a high velocity layer 805 disposed in the dielectric layer 115 is also illustrated in FIG. 16C for comparison. As can be seen in FIGS. 16B and 16C, the TCF of both the resonance frequency and the antiresonance frequency are improved (shifted closer to zero) by inclusion of the high velocity layer 805 in the dielectric film layer 115.

Figure 17:
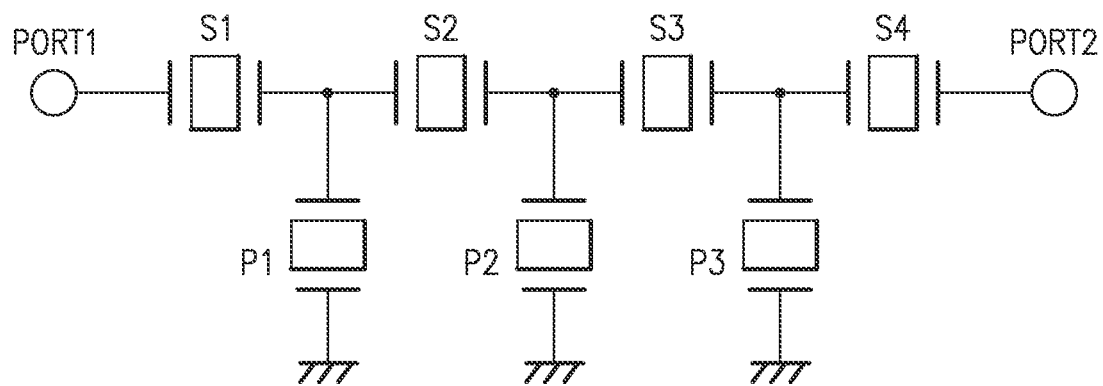
FIG. 17 is a schematic view of another ladder filter.

A ladder filter may include a plurality of series resonators electrically coupled in series between an input port and an output port and a plurality of parallel resonators connected between terminals of the series resonators and ground. One example of a ladder filter is illustrated schematically in FIG. 17, where the series resonators are indicated at S1, S2, S3, and S4 and the parallel resonators are indicated at P1, P2, and P3. In some embodiments, a high velocity layer 805 may be formed in the dielectric layer 115 of only those resonators in which one wishes to adjust a TCF or only those resonators which exhibit a spurious shear wave below between their respective resonance and anti-resonance frequencies. In some embodiments of a ladder filter such as is illustrated in FIG. 17, only one or a sub-set of the parallel resonators, for example, resonator P3 or, alternatively, one or a sub-set of the series resonators S1, S2, S3, and S4 may include a high velocity layer 805 formed in a dielectric layer 115 covering the IDT electrodes of the resonator while the other resonators do not include a high velocity layer 805 formed in a dielectric layer 115 covering the respective IDT electrodes of the respective other resonators.

Figure 18:
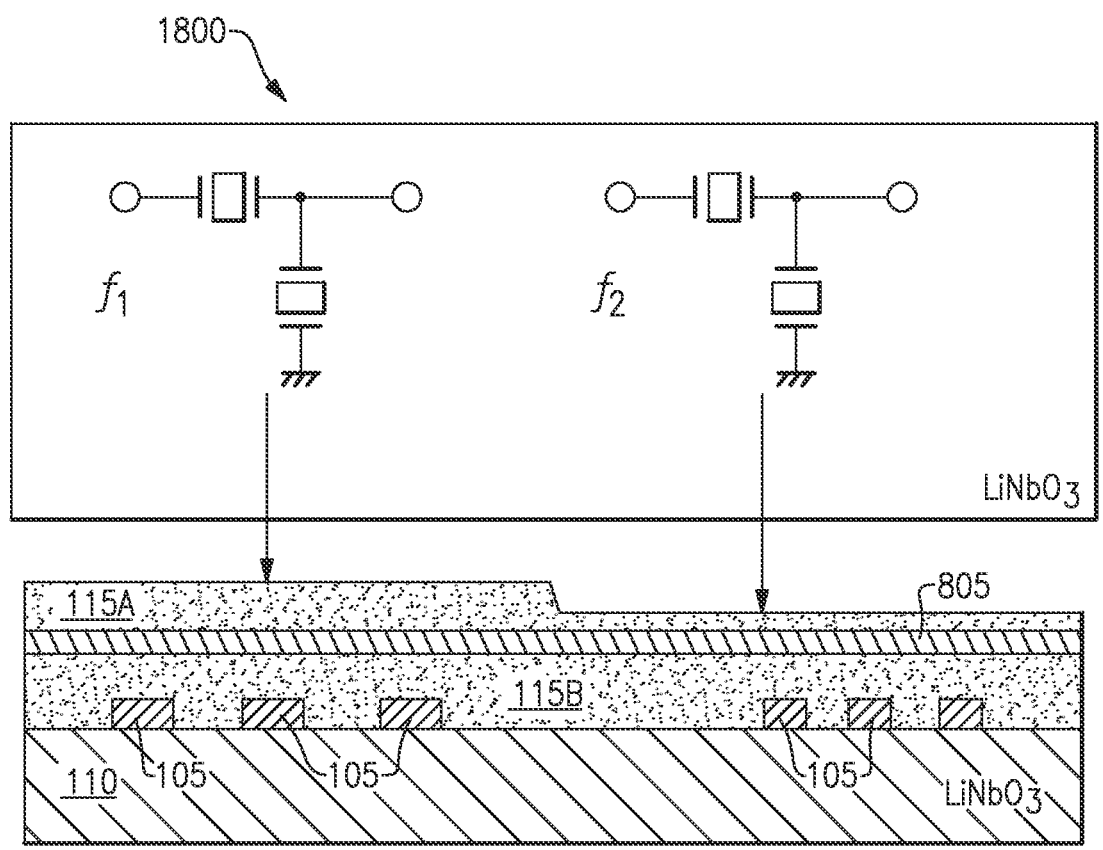
FIG. 18 illustrates an example of differences in film thicknesses for resonators of two filters formed on a common piezoelectric substrate.

For embodiments including multiple filters formed on a common piezoelectric substrate, for example, as illustrated in FIG. 7, only a subset of the filters may include resonators with a high velocity layer 805 formed in the dielectric layer 115 covering the IDT electrodes of the one or more resonators of the subset of filters. Alternatively, only a subset of the filters may include a resonator lacking the high velocity layer 805. For example, in the chip schematically illustrated in FIG. 7, filters $f_1$ and $f_4$ may have a high velocity layer 805 formed in the dielectric layer 115 covering the IDT electrodes of one or more resonators of the filters while filters $f_2$ and $f_3$ do not. Alternatively, each of the filters $f_1$, $f_2$, $f_3$, and $f_4$ may include at least one resonator including a high velocity layer 805 disposed within a respective dielectric layer 115. In some embodiments, in filters having a high velocity layer 805 formed in the dielectric layer 115 covering the IDT electrodes of one or more resonators of the filters, the high velocity layer 805 may be formed over at least one series resonator and at least one parallel resonator. In other embodiments, in filters having a high velocity layer 805 formed in the dielectric layer 115 covering the IDT electrodes of one or more resonators of the filters, the high velocity layer 805 may be formed over each of the series resonators and each of the parallel resonators In a filter having resonators with different resonant and antiresonant frequencies or in a chip including filters with different passbands, the relative thicknesses of upper and lower portions 115A and 115B of the dielectric layer 115 and the high velocity layer 805 in the different resonators or filters may be selected in accordance with different criteria. In one example of a chip 1800 including a first filter $f_1$ and a second filter $f_2$, where the passband of the filter $f_1$ is at a lower frequency than the passband of the filter $f_2$, the IDT electrodes 105 of resonators in the filter $f_1$ may have greater period than the IDT electrodes 105 in resonators of filter $f_2$. In some embodiments, the upper portion 115A on the dielectric layer 155 on the resonator(s) having the narrower (lesser) IDT electrode period may be etched-back to align the normalized thickness $h_{SiO2}/\lambda$ in the resonators with the greater IDT electrode period and the resonators having the narrower IDT electrode period. Aligning the normalized thickness $h_{SiO2}/\lambda$ in the resonators with the greater IDT electrode period and the resonators having the narrower IDT electrode period may provide the different resonators with similar coupling coefficients $k^2$, TCF, and levels of shear mode spurious signals (See FIG. 5 and FIG. 6.) An example of this embodiment is illustrated in FIG. 18.

Figure 19:
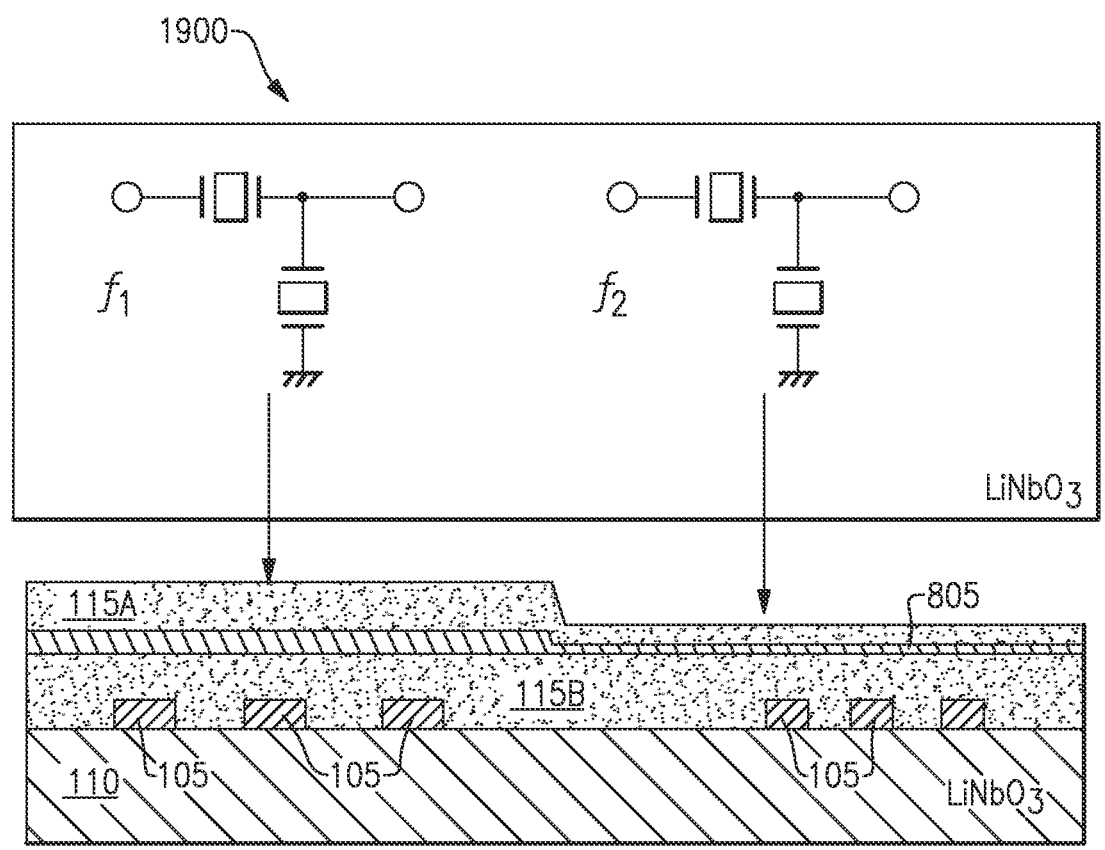
FIG. 19 illustrates another example of differences in film thicknesses for resonators of two filters formed on a common piezoelectric substrate.

In a modification to the chip 1800, the high velocity layer 805 disposed over the IDT electrodes 105 in resonators of filter $f_2$ may be etched-back to align the normalized thickness $h/\lambda$ between the resonators of the two filters. This may provide the different resonators with similar frequency differences between the antiresonance frequencies of the longitudinal wave vibration mode (Rayleigh mode) and the resonance frequency of the shear wave vibration mode, similar quality factors, and similar coupling coefficients $k^2$ (See FIGS. 12, 14, and 15.) An example of this embodiment is illustrated generally at 1900 in FIG. 19.

Figure 20:
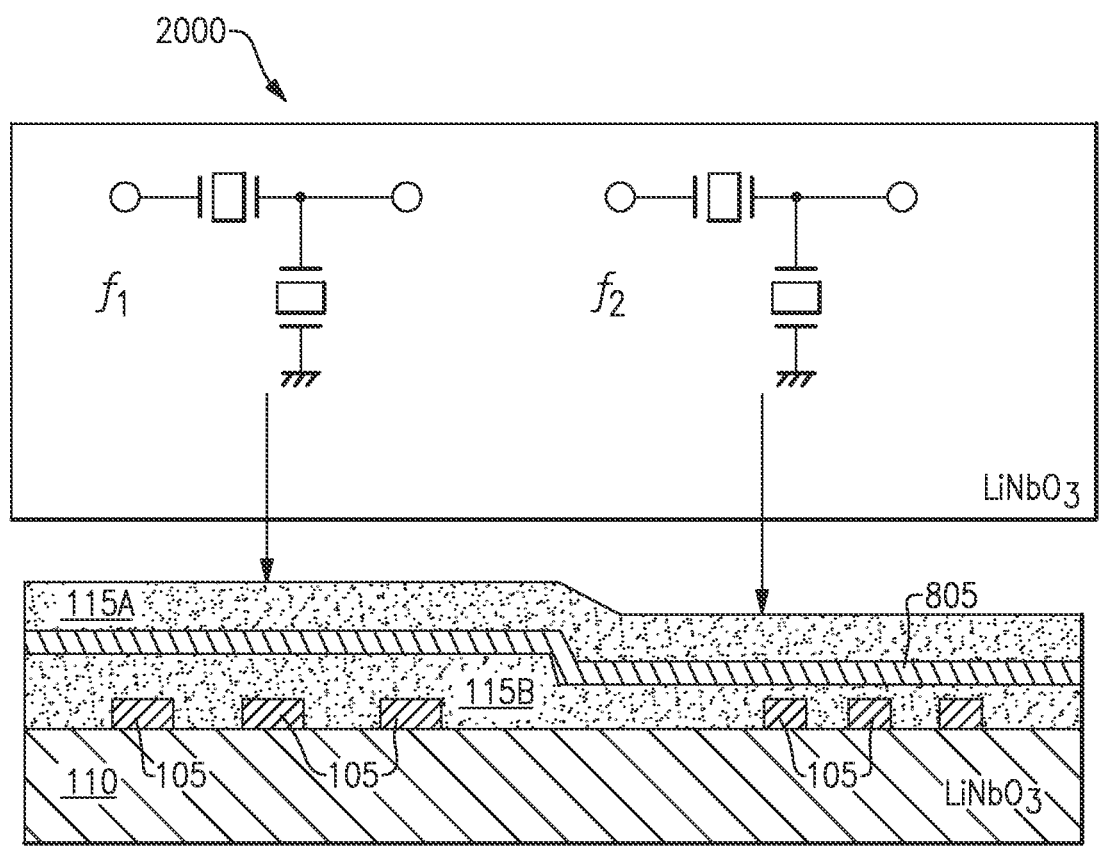
FIG. 20 illustrates another example of differences in film thicknesses for resonators of two filters formed on a common piezoelectric substrate.

In another embodiment of a chip 2000 including a first filter $f_1$ and a second filter $f_2$, where the passband of the filter $f_1$ is at a lower frequency than the passband of the filter $f_2$, and the IDT electrodes 105 of resonators in the filter $f_1$ have a greater period than the IDT electrodes 105 in resonators of filter $f_2$, the lower portion 115B of the dielectric film 115 disposed over the IDT electrodes 105 in resonators of filter $f_2$ may be etched-back to align the normalized height of the high velocity layer 805 within the dielectric layer 115 between the resonators of the different filters. This may provide for optimization of the frequency difference between the antiresonance frequencies of the longitudinal wave vibration mode (Rayleigh mode) and the resonance frequency of the shear wave vibration mode, quality factors, and coupling coefficients $k^2$ in each of the different resonators. (See FIGS. 12, 14, and 15.) An example of this embodiment is illustrated in FIG. 20.

Figure 21:
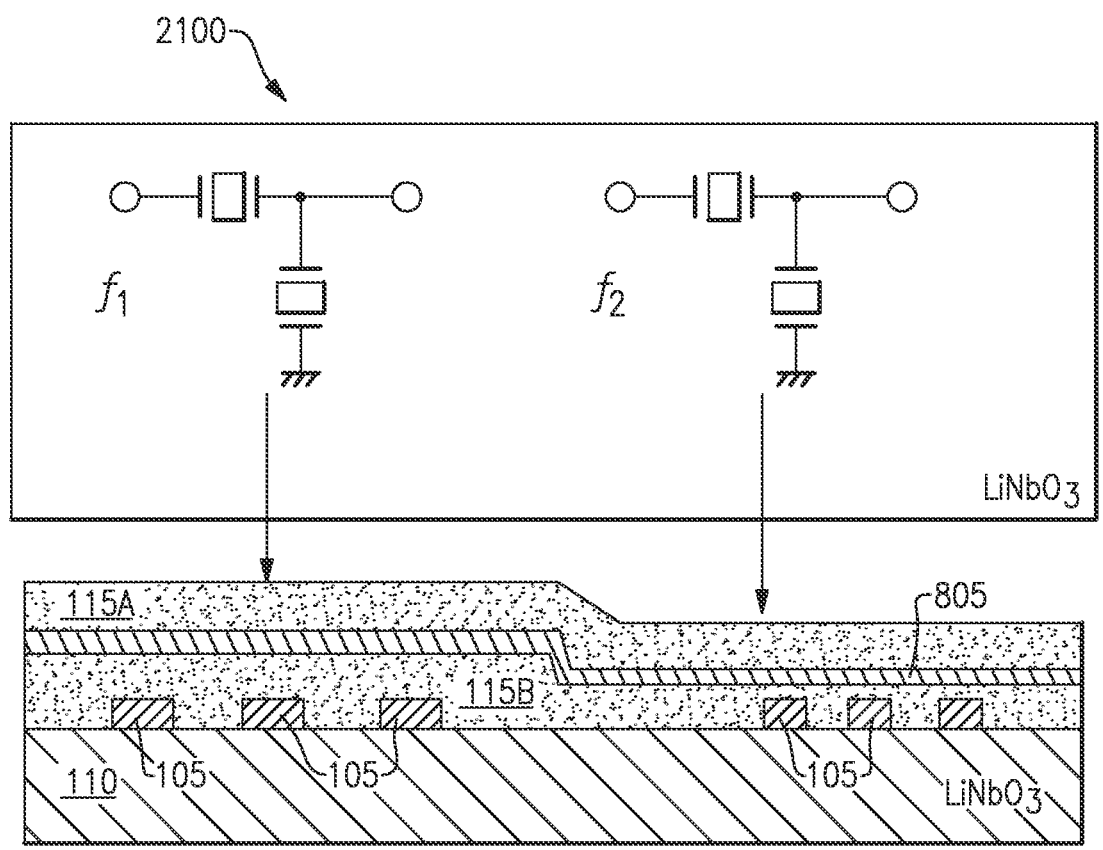
FIG. 21 illustrates another example of differences in film thicknesses for resonators of two filters formed on a common piezoelectric substrate.

In a modification to the chip 2000, the high velocity layer 805 disposed over the IDT electrodes 105 in resonators of filter $f_2$ may be etched-back to align the normalized thickness $h/\lambda$ between the resonators of the two filters. This may provide the different resonators with similar frequency differences between the antiresonance frequencies of the longitudinal wave vibration mode (Rayleigh mode) and the resonance frequency of the shear wave vibration mode, similar quality factors, and similar coupling coefficients $k^2$ (See FIGS. 12, 14, and 15.) An example of this embodiment is illustrated generally at 2100 in FIG. 21.

The different combinations of thicknesses of the dielectric layers 115 and high velocity layers 85 illustrated in FGS. 18-21 may apply to different resonators within a single filter or to different resonators in different filters.

Figure 22B:
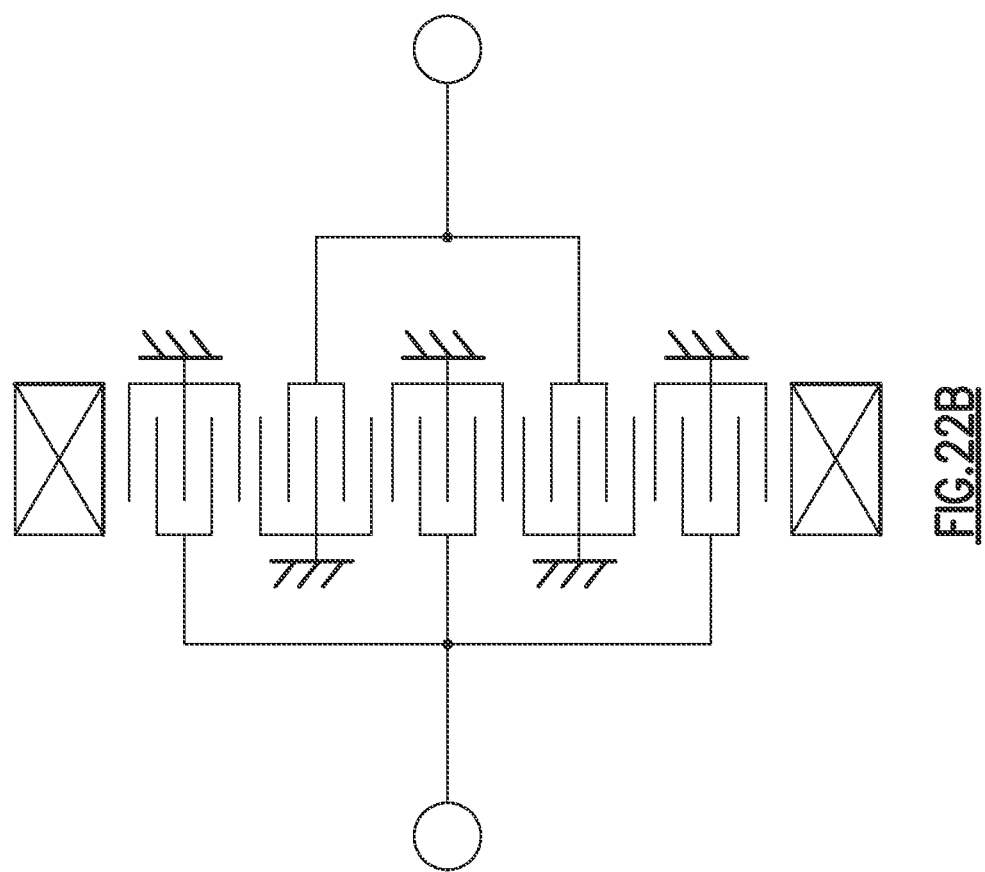
FIG. 22B illustrates an embodiment of a multi-mode SAW filter.
Figure 22A:
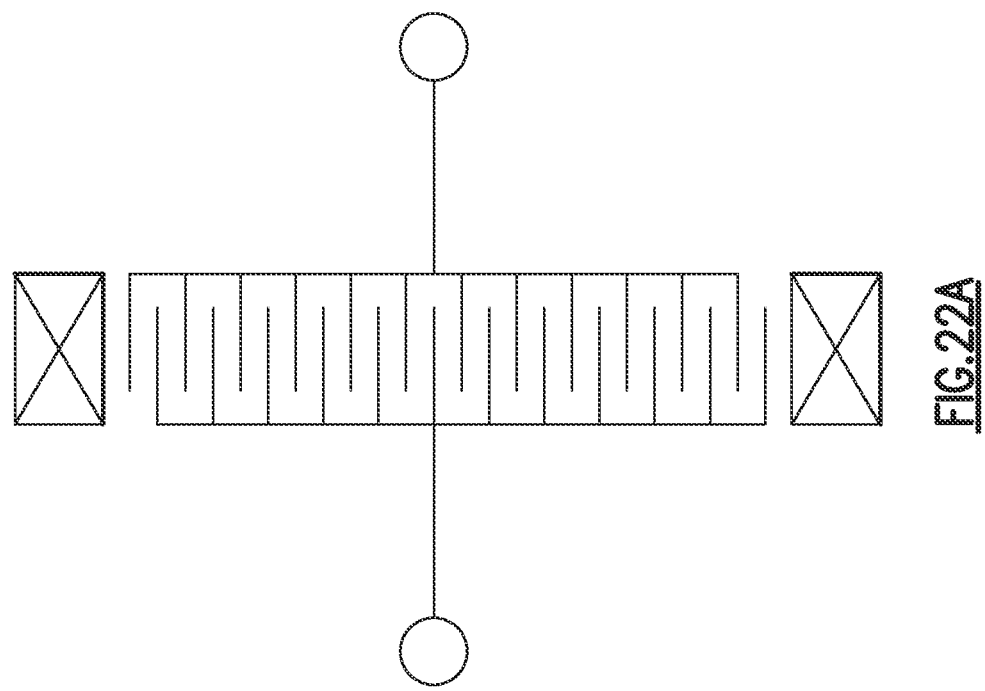
FIG. 22A illustrates an embodiment of a SAW resonator.

Any of the aspects and embodiments disclosed herein may be utilized in a SAW resonator, an example of which is illustrated in FIG. 22A, or a multi-mode SAW filter, an example of which is illustrated in FIG. 22B. The multi-mode SAW filter of FIG. 22B may be a dual-mode SAW filter (a DMS filter).

Filters as illustrated in any of the above referenced embodiments may be used in a wide range of electronic devices.

Figure 23:
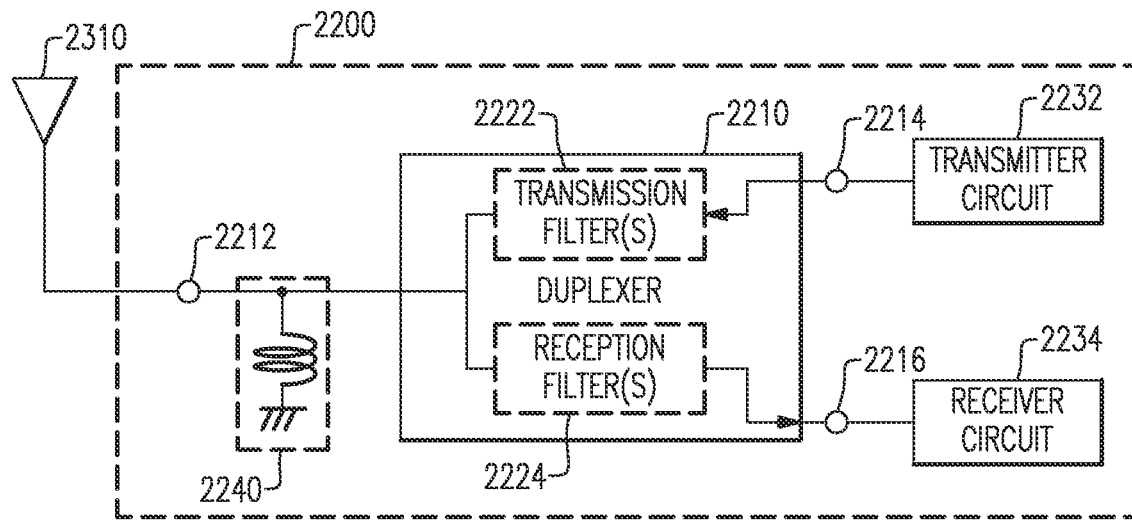
FIG. 23 is a block diagram of a front-end module in which any of the filters disclosed herein may be implemented.

Referring to FIG. 23, there is illustrated a block diagram of one example of a front-end module 2200, which may be used in an electronic device such as a wireless communications device (e.g., a mobile phone) for example. The front-end module 2200 includes an antenna duplexer 2210 having a common node 2212, an input node 2214, and an output node 2216. An antenna 2310 is connected to the common node 2212. The front-end module 2200 further includes a transmitter circuit 2232 connected to the input node 2214 of the duplexer 2210 and a receiver circuit 2234 connected to the output node 2216 of the duplexer 2210. The transmitter circuit 2232 can generate signals for transmission via the antenna 2310, and the receiver circuit 2234 can receive and process signals received via the antenna 2310. In some embodiments, the receiver and transmitter circuits are implemented as separate components, as shown in FIG. 23; however in other embodiments these components may be integrated into a common transceiver circuit or module. As will be appreciated by those skilled in the art, the front-end module 2200 may include other components that are not illustrated in FIG. 23 including, but not limited to, switches, electromagnetic couplers, amplifiers, processors, and the like.

The antenna duplexer 2210 may include one or more transmission filters 2222 connected between the input node 2214 and the common node 2212, and one or more reception filters 2224 connected between the common node 2212 and the output node 2216. The passband(s) of the transmission filter(s) are different from the passband(s) of the reception filters. Each of the transmission filter(s) 2222 and the reception filter(s) 2224 may include an embodiment of a filter as disclosed herein. An inductor or other matching component 2240 may be connected at the common node 2212.

In certain examples, the acoustic wave elements used in the transmission filter 2222 and/or the reception filter 2224 are disposed on a single piezoelectric substrate. This structure reduces the effect of changes in temperature upon the frequency responses of the respective filters, in particular, reducing degradation in the passing or attenuation characteristics of the filters due to changes in the temperature, because each acoustic wave element in each of the filters changes similarly in response to changes in the ambient temperature. In instances where there is a change in temperature of the first of the filters due to heat transferred through the substrate from the second of the filters to the first of the filters, the use of a high velocity layer in the dielectric film in a first of the filters may further reduce the degradation in the passing or attenuation characteristics. In addition, this arrangement (being disposed on the single piezoelectric substrate) may also allow the transmission filter 2222 or reception filter 2224 to have a small size.

Figure 24:
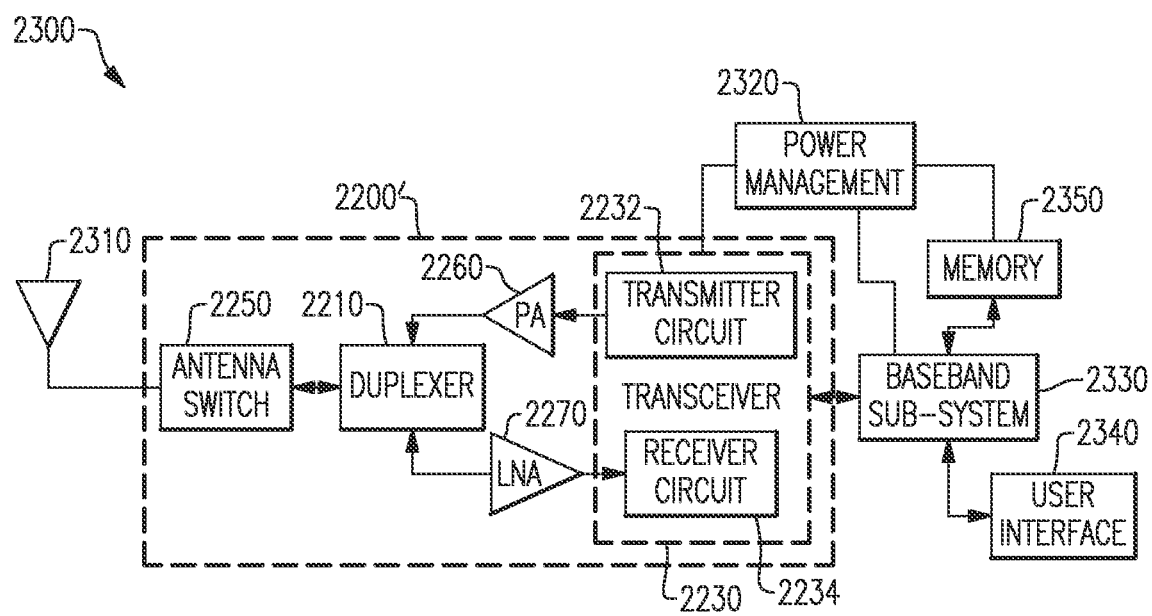
FIG. 24 is a block diagram of a wireless device in which any of the filters disclosed herein may be implemented.

FIG. 24 is a block diagram of one example of a wireless device 2300 including the antenna duplexer 2210 shown in FIG. 23. The wireless device 2300 can be a cellular phone, smart phone, tablet, modem, communication network or any other portable or non-portable device configured for voice or data communication. The wireless device 2300 can receive and transmit signals from the antenna 2310. The wireless device includes an embodiment of a front-end module 2200' similar to that discussed above with reference to FIG. 23. The front-end module 2200' includes the duplexer 2210, as discussed above. In the example shown in FIG. 24 the front-end module 2200' further includes an antenna switch 2250, which can be configured to switch between different frequency bands or modes, such as transmit and receive modes, for example. In the example illustrated in FIG. 24, the antenna switch 2250 is positioned between the duplexer 2210 and the antenna 2310; however, in other examples the duplexer 2210 can be positioned between the antenna switch 2250 and the antenna 2310. In other examples the antenna switch 2250 and the duplexer 2210 can be integrated into a single component.

The front end module 2200' includes a transceiver 2230 that is configured to generate signals for transmission or to process received signals. The transceiver 2230 can include the transmitter circuit 2232, which can be connected to the input node 2214 of the duplexer 2210, and the receiver circuit 2234, which can be connected to the output node 2216 of the duplexer 2210, as shown in the example of FIG. 23.

Signals generated for transmission by the transmitter circuit 2232 are received by a power amplifier (PA) module 2260, which amplifies the generated signals from the transceiver 2230. The power amplifier module 2260 can include one or more power amplifiers. The power amplifier module 2260 can be used to amplify a wide variety of RF or other frequency-band transmission signals. For example, the power amplifier module 2260 can receive an enable signal that can be used to pulse the output of the power amplifier to aid in transmitting a wireless local area network (WLAN) signal or any other suitable pulsed signal. The power amplifier module 2260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 2260 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 24, the front-end module 2200' may further include a low noise amplifier module 2270, which amplifies received signals from the antenna 2310 and provides the amplified signals to the receiver circuit 2234 of the transceiver 2230.

The wireless device 2300 of FIG. 24 further includes a power management sub-system 2320 that is connected to the transceiver 2230 and manages the power for the operation of the wireless device 2300. The power management system 2320 can also control the operation of a baseband sub-system 2330 and various other components of the wireless device 2300. The power management system 2320 can include, or can be connected to, a battery (not shown) that supplies power for the various components of the wireless device 2300. The power management system 2320 can further include one or more processors or controllers that can control the transmission of signals, for example. In one embodiment, the baseband sub-system 2330 is connected to a user interface 2340 to facilitate various input and output of voice and/or data provided to and received from the user. The baseband sub-system 2330 can also be connected to memory 2350 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. One or more features of any embodiment disclosed herein may be added to or substituted for any one or more features of any other embodiment. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation. Accordingly, the foregoing description and drawings are by way of example only.

What is claimed is:

1. An electronic device comprising:
   a first surface acoustic wave (SAW) resonator and a second SAW resonator, each including interleaved interdigital transducer (IDT) electrodes, the first and second SAW resonators being formed on a same piezoelectric substrate, the first SAW resonator having IDT electrodes with a different finger pitch than the IDT electrodes of the second SAW resonator;
   a dielectric material layer disposed on the IDT electrodes of the first and second SAW resonators; and
   a high velocity layer disposed within the dielectric material layer disposed on the IDT electrodes of the first SAW resonator and within the dielectric material layer disposed on the IDT electrodes of the second SAW resonator, the dielectric material layer disposed on the IDT electrodes of the first SAW resonator having a same normalized thickness as a normalized thickness of the dielectric material layer disposed on the IDT electrodes of the second SAW resonator, a normalized thickness of the high velocity layer disposed within the dielectric material layer covering the IDT electrodes of the first SAW resonator being different from a normalized thickness of the high velocity layer disposed within the dielectric material layer covering IDT electrodes of the second SAW resonator.

2. The electronic device of claim 1 wherein the dielectric material layer comprises silicon dioxide.

3. The electronic device of claim 2 wherein the high velocity layer comprises one or more of silicon nitride, silicon oxynitride, aluminum nitride, aluminum oxide, or diamond.

4. The electronic device of claim 1 wherein the high velocity layer is located between about 0% and about 40% of the thickness of the dielectric material layer above the IDT electrodes of the first SAW resonator.

5. The electronic device of claim 1 included in an electronic device module.

6. The electronic device of claim 5 wherein the electronic device module is a radio frequency device module.

7. An electronic device comprising:
   a first filter and a second filter, each including surface acoustic wave (SAW) resonators disposed on a same piezoelectric substrate, the first filter having a passband different than a passband of the second filter;
   a dielectric film covering the SAW resonators of the first and second filters; and
   a high velocity layer disposed within the dielectric film covering the SAW resonators of the first filter and at least one of the SAW resonators of the second filter, the dielectric film covering the SAW resonators of the first filter having a same normalized thickness as a normalized thickness of the dielectric film covering the SAW resonators of the second filter, a normalized height of the high velocity layer disposed within the dielectric film covering the SAW resonators of the first filter being different from a normalized height of the high velocity layer disposed within the dielectric film covering the at least one of the SAW resonators of the second filter.

8. The electronic device of claim 7 wherein the high velocity layer disposed within the dielectric film covering at least one of the SAW resonators of the first filter has a same thickness as the high velocity layer disposed within the dielectric film covering the at least one of the SAW resonators of the second filter.

9. The electronic device of claim 7 wherein the high velocity layer disposed within the dielectric film covering at least one of the SAW resonators of the first filter has a different thickness than the high velocity layer disposed within the dielectric film covering the at least one of the SAW resonators of the second filter.

10. The electronic device of claim 7 wherein a normalized thickness of the high velocity layer within the dielectric film covering at least one of the SAW resonators of the first filter is the same as the normalized thickness of the high velocity layer within the dielectric film covering the at least one of the SAW resonators of the second filter.

11. The electronic device of claim 7 wherein the dielectric film covering the SAW resonators of the first filter includes an upper portion disposed on an upper surface of the high velocity layer and a lower portion disposed between a lower surface of the high velocity layer and upper surfaces of interdigital transducer electrodes of at least one of the SAW resonators of the first filter.

12. The electronic device of claim 11 wherein a thickness of the lower portion of the dielectric film covering the at least one of the SAW resonators of the first filter has a different thickness than a lower portion of the dielectric film covering the at least one of the SAW resonators of the second filter.

13. The electronic device of claim 7 wherein a normalized height of the high velocity layer within the dielectric film covering at least one of the SAW resonators of the first filter is the same as the normalized height of the high velocity layer within the dielectric film covering the at least one of the SAW resonators of the second filter.

14. The electronic device of claim 13 wherein a normalized thickness of the high velocity layer within the dielectric film covering at least one of the SAW resonators of the first filter is different than the normalized thickness of the high velocity layer within the dielectric film covering the at least one of the SAW resonators of the second filter.

15. The electronic device of claim 7 wherein a thickness of the high velocity layer within the dielectric film covering at least one of the SAW resonators of the first filter has a different thickness than the high velocity layer within the dielectric film covering the at least one of the SAW resonators of the second filter.

16. The electronic device of claim 15 wherein a normalized thickness of the high velocity layer within the dielectric film covering at least one of the SAW resonators of the first filter is the same as the normalized thickness of the high velocity layer within the dielectric film covering the at least one of the SAW resonators of the second filter.

17. The electronic device of claim 7 included in an electronic device module.

18. The electronic device of claim 17 wherein the electronic device module is a radio frequency device module.

19. An electronic device comprising:
a first surface acoustic wave (SAW) resonator and a second SAW resonator, each including interleaved interdigital transducer (IDT) electrodes, the first and second SAW resonators being formed on a same piezoelectric substrate, the first SAW resonator having IDT electrodes with a different finger pitch than the IDT electrodes of the second SAW resonator;
a dielectric material layer disposed on the IDT electrodes of the first and second SAW resonators; and
a high velocity layer disposed within the dielectric material layer disposed on the IDT electrodes of the first SAW resonator and within the dielectric material layer disposed on the IDT electrodes of the second SAW resonator, the dielectric material layer disposed on the IDT electrodes of the first SAW resonator having a same normalized thickness as a normalized thickness of the dielectric material layer disposed on the IDT electrodes of the second SAW resonator, a normalized height of the high velocity layer disposed within the dielectric material layer covering the IDT electrodes of the first SAW resonator being different from a normalized height of the high velocity layer disposed within the dielectric material layer covering IDT electrodes of the second SAW resonator.

20. The electronic device of claim 19 wherein the high velocity layer is disposed within the dielectric material layer disposed on the IDT electrodes of the first SAW resonator at a same height as a height at which the high velocity layer is disposed within the dielectric material layer disposed on the IDT electrodes of the second SAW resonator.

* * * * *